United States Patent [19]

Iwamoto et al.

[11] Patent Number: 5,708,611
[45] Date of Patent: Jan. 13, 1998

[54] SYNCHRONOUS SEMICONDUCTOR MEMORY DEVICE

[75] Inventors: Hisashi Iwamoto; Yasuhiro Konishi, both of Hyogo, Japan

[73] Assignee: Mitsubishi Denki Kabushiki Kaisha, Tokyo, Japan

[21] Appl. No.: 801,889

[22] Filed: Feb. 18, 1997

Related U.S. Application Data

[63] Continuation of Ser. No. 524,927, Sep. 8, 1995, Pat. No. 5,629,897.

[30]    Foreign Application Priority Data

Nov. 22, 1994  [JP]  Japan .................. 6-287950

[51] Int. Cl.⁶ ........................................ G11C 8/00
[52] U.S. Cl. .................. 365/195; 365/222; 365/233
[58] Field of Search ........................ 365/191, 194, 365/195, 189.07, 222, 233

[56]       References Cited

U.S. PATENT DOCUMENTS 5,444,667  8/1995  Obara ..................... 365/233
5,469,386  11/1995  Obara ..................... 365/222
5,477,491  12/1995  Shirai ..................... 365/194
5,495,452  2/1996  Cha ....................... 365/222
5,608,682  3/1997  Jinbo et al. ............... 365/222

FOREIGN PATENT DOCUMENTS 4-37162    2/1992   Japan .
5-13722    1/1993   Japan .
5-174578   7/1993   Japan .
5-283652   10/1993  Japan .

OTHER PUBLICATIONS

Natsuki Kushiymam et al., IEEE Journal of Solid-State Circuits, vol. 28, No. 4, "A 500 Megabyte/s Data-Rate 4.5M DRAM", Apr. 1993, pp.490-497.

Primary Examiner—David C. Nelms
Assistant Examiner—Son Mai
Attorney, Agent, or Firm—Lowe, Price, LeBlanc & Becker

[57]          ABSTRACT

A refresh control circuit of a DLL circuit responds to an auto refresh detection signal AR and a self refresh detection signal SR to inhibit input of clock signals ECLK and RCLK to a phase comparator and to a voltage control delay circuit. The DLL circuit can be stopped in a mode where an internal clock signal is not required to reduce power consumption.

5 Claims, 25 Drawing Sheets

SYNCHRONOUS SEMICONDUCTOR MEMORY DEVICE

RELATED APPLICATION

This is a continuation of U.S. patent application Ser. No. 08,524,927 filed Sep. 8, 1995, now U.S. Pat. No. 5,629,897.

BACKGROUND OF THE INVENTION

1. Field of the Invention

The present invention relates to synchronous semiconductor memory devices, and more particularly, to a synchronous semiconductor memory device receiving an external signal including a control signal, an address signal, and input data in synchronization with an external clock signal.

2. Description of the Background Art

Although the operation rate of a dynamic random access memory (referred to as DRAM hereinafter) used as a main memory has been increasingly improved, it cannot yet follow that of a microprocessor (referred to as MPU hereinafter). Degradation in the performance of the entire system is encountered due to the bottleneck of the access time and the cycle time of a DRAM. A synchronous DRAM that operates in synchronization with a clock signal (referred to as SDRAM hereinafter) is proposed to be used as the main memory for high speed MPUs. An SDRAM will be described hereinafter with reference to the block diagram of FIG. 10 showing the structure of the main components of a conventional SDRAM.

FIG. 10 shows the functional structure associated with input and output of 1-bit data of an SDRAM of a ×8 bit organization. An array corresponding to a data input/output terminal DQi includes a memory array 51a forming a bank #1, and a memory array 51b forming a bank #2.

An X decoder group 52a including a plurality of row decoders for decoding address signals X0–Xj to select a corresponding row in a memory array 51a, an Y decoder group 53a including a plurality of column decoders for decoding column address signals Y3–Yk to generate a column select signal for selecting a corresponding column in memory array 51a, and a sense amplifier group 54a for detecting and amplifying data of a memory cell connected to a selected row in memory array 51a are connected to memory array 51a of bank #1.

X decoder group 52a includes a row decoder provided corresponding to each word line of memory array 51a. A corresponding row decoder attains a selected state according to address signals X0–Xj, whereby a word line provided corresponding to a selected row decoder is selected.

Y decoder group 53a includes a column decoder provided corresponding to each column select line of memory array 51a. One column select line renders a set of eight bit lines to a selected state. In response to the operation of X decoder group 52a and Y decoder group 53a, memory cells of 8 bits are selected simultaneously in memory array 51a. X and Y decoder groups 52a and 53a are activated in response to a bank specify signal B1.

A bus GIO of an internal data transmission line (global IO line) is connected to bank #1 for transmitting amplified data from sense amplifier group 54a and for providing write data into a selected memory cell in memory array 51a. Global IO bus GIO includes 8 global IO lines to transfer data simultaneous to the selected 8 bits of memory cells.

A preamplifier group 55a responsive to a preamplifier activation signal φPA1 to amplify data on global IO line bus GIO, a read register 56a for storing the amplified data from preamplifier group 55a, and an output buffer 57a for sequentially providing data stored in read register 56a are connected with respect to bank #1 for data readout.

Preamplifier group 55a and read register 56a each have a configuration of 8 bits in width corresponding to the eight global IO lines. Read register 56a responds to a register activation signal φRr1 to latch and sequentially output data provided from preamplifier group 55a.

Output buffer 57a responds to an output enable signal φOE1 to provide 8 bits of data sequentially output from read register 56a to a data input/output terminal DQi. Although data input and output is shown to be carried out via data input/output terminal DQi in FIG. 10, a structure may be employed in which data input and output is carried out via another terminal.

A 1-bit width input buffer 58a activated in response to an input buffer activation signal φDB1 to generate internal write data from the input data applied to data input/output terminal DQi, a write register 59a activated in response to a register activation signal φRw1 to sequentially store (according to a wrap address) write data provided from input buffer 58a, and a write buffer group 60a activated in response to a write buffer activation signal φWB1 to amplify and provide to global IO line bus GIO the data stored in write register 59a are provided to carry out data writing.

Write buffer group 60a and write register 59a each have a width of 8 bits.

Similarly, a memory array 51b, an X decoder group 52b, an Y decoder group 53b, a sense amplifier group 54b activated in response to a sense amplifier activation signal φSA2, a preamplifier group 55b activated in response to a preamplifier activation signal φPA2, a read register 56b activated in response to a register activation signal φRr2, an output buffer 57b activated in response to an output enable signal φOE2, a write buffer group 60b activated in response to a buffer activation signal φWB2, a write register 59b activated in response to a register activation signal φRw2, and an input buffer 58b activated in response to a buffer activation signal φDB2 are provided with respect to bank #2.

Bank #1 has a structure similar to that of bank #2. Data input and output can be carried out in synchronization with a high speed clock signal with respect to one data input/output terminal DQi by providing read registers 56a and 56b and write registers 59a and 59b.

As to each control signal of banks #1 and #2, only a control signal with respect to either bank is generated according to bank specify signals B1 and B2.

Functional block 61 shown in FIG. 10 is provided with respect to each data input/output terminal. In an SRAM of a ×8 bit organization, 8 functional blocks 61 are provided.

Banks #1 and #2 can be operated substantially independent of each other by setting the structures of banks #1 and #2 substantially equal to each other and activating only one of bank specify signals B1 and B2.

By providing respective registers 56a and 56b for data readout and registers 59a and 59b for data writing to each of banks #1 and #2, data can be read out and written properly with no collision in data during the operation mode switching between data reading and writing and during bank switching.

A first control signal generation circuit 62, a second control signal generation circuit 63, and a clock counter 64 are provided as the control system to drive banks #1 and #2 independently.

First control signal generation circuit 62 receives an externally applied control signal such as an external row address strobe signal ext./RAS, an external column address strobe signal ext./CAS, an external output enable signal ext./OE, an external write enable signal (write enable signal) ext./WE and a mask designating signal WM in synchronization with an external clock signal CLK which is a system clock, for example, to generate internal control signals φxa, φya, φW, φO, φR, and φC.

Second control signal generation circuit 63 responds to bank specify signals B1, B2, internal control signals φW, φO, φR, φC, and clock signal CLK to generate control signals for driving each of banks #1 and #2 independently, i.e. generates sense amplifier activation signals φSA1, φSA2, preamplifier activation signals φPA1, φPA2, write buffer activation signals φWB1, φWB2, input buffer activation signals φDB1, φDB2, and output buffer activation signals φOE1, φOE2.

The SDRAM further includes as peripheral circuitry an X address buffer 65 responsive to an internal control signal φxa to receive external address signals ext./A0 to ext./Ai for generating internal address signals x0–xj and bank select signals B1 and B2, an Y address buffer 66 activated in response to an internal control signal φya for generating column select signals Y3–Yk for specifying a column select line, wrap address bits Y0–Y2 for specifying the first bit line pair (column) in a continuous access, and bank specify signals B1 and B2, and a register control circuit 67 for generating wrap addresses WY0–WY7 register, drive signals φRr1 and φRr2 for controlling read registers 56a and 56b, and control signals φRw1 and φRw2 to drive write registers 59a and 59b.

Register control circuit 67 receives bank specify signals B1 and B2 to generate a register drive signal with respect to a selected bank.

FIG. 11 is a timing chart indicating the state of respective external signals when data of 8 bits (a total of 64 bits by 8×8) are read out successively in the above-described SDRAM.

The SDRAM receives an externally applied control signal or address signal Add at a rising edge of an external clock signal CLK which is a system clock, for example. Address signal Add includes a row address signal X and a column address signal Y that are multiplexed in a time-divisional manner.

When external row address strobe signal ext./RAS attains an active state of an L level (logical low) and external column address strobe signal ext./CAS and external write enable signal ext./WE attain an H level (logical high) at a rising edge of clock signal CLK at cycle 1, address signal Add at that time is input as a row address signal X.

When external column address strobe signal ext./CAS attains an active state of an L level at a rising edge of clock signal CLK at cycle 4, address signal Add at that time is input as a column address Y. Column and row select operations are carried out in the SDRAM according to the input row and column address signals Xa and Yb. The first data b0 is output at the elapse of a predetermined clock time period (6 clock cycles in FIG. 11) from the fall of external row address strobe signal ext./RAS to an L level. Data b1–b7 are output thereafter in response to the fall of clock signal CLK.

FIG. 12 is a timing chart showing the state of external signals when reading out data of 8 bits successively in the SDRAM.

Input of a row address signal Xc in a writing operation is similar to that of a data readout operation. More specifically, when signal ext./RAS attains an activation state of an L level, and signals ext./CAS and ext./WE attain an H level at a rising edge of clock signal CLK at cycle 1, address signal Add is input as a row address signal Xa. When signals ext./CAS and ext./WE both attain an active state of an L level at a rising edge of clock signal CLK at cycle 3, column address signal Yb is input, and data b0 provided is entered as the first write data. Row and column select operations are carried out in the SDRAM in response to the falling edge of signals ext./RAS and ext./CAS. Input data b1–b7 are sequentially input in synchronization with clock signal CLK to be sequentially written into an appropriate memory cell.

A refresh operation of the SDRAM will be described hereinafter. Two types of refresh modes are provided for the SDRAM. The first is an auto-refresh mode where memory array 51a or 51b of either bank #1 or #2 is refreshed in response to a command. The second is a self refresh mode in which memory arrays 51a and 51b of banks #1 and #2 are refreshed alternately starting from a start command and an end command.

The auto-refresh mode will be first described with reference to FIG. 13 showing the structure of the components associated with an auto-refresh mode. The SDRAM includes an auto refresh detection circuit 70 for detecting whether an auto-refresh mode is specified or not upon determination of the state of external control signals ext./RAS, ext./CAS, and ext./WE at the rising edge of clock signal CLK, an address counter 71 for generating a refresh address, active control circuits 72a and 72b responsive to a bank address RBA generated from address counter 71 and an auto refresh detection signal AR generated from auto refresh detection circuit 70 for generating internal RAS signals int.RASA and int.RASB, respectively, with respect to the bank specified at the time of the auto-refresh mode, and row select drive circuits 73a and 73b responsive to internal RAS signals int.RASA and int.RASB from active control circuits 72a and 72b, respectively, for driving the circuit components related to row selection of a corresponding memory array.

Auto refresh detection circuit 70 is provided in first control signal generation circuit 62, and active control circuits 72a and 72b and row select drive circuits 73a and 73b are provided in second control signal generation circuit 63 of FIG. 10.

A control circuit for activating a memory array when an active command is input (not shown in FIG. 13) is additionally provided. The control circuit that operates when an active command is input generates an internal RAS signal. Therefore, the results of the OR of an internal RAS signal generated when an active command is input and internal RAS signals int.RASA and int.RASB from active control circuits 72a and 72b shown in FIG. 13 are provided to row select drive circuits 73a and 73b.

Referring to FIG. 13, the SDRAM further includes a multiplexer 74 for selectively passing through one of a refresh address from address counter 71 (an address indicating the row of a memory to be refreshed) and an external address signal according to an auto refresh detection signal AR, and an address buffer 75 for receiving an address signal from multiplexer 74 in response to a clock signal CLK, and row decoders 76a and 76b for decoding an internal row address signal from address buffer 75.

Row decoders 76a and 76b are controlled according to a control signal from row select drive circuits 73a and 73b, respectively. Row decoder 76a selects one row of memory cells in the memory array of bank #1, and row decoder 76b selects 1 row of memory cells in the memory array of bank #2.

According to the structure shown in FIG. 13, row select drive circuits 73a and 73b are shown to drive row decoders 76a and 76b, respectively. Row select drive circuits 73a and 73b generates and provides to a selected word line a word line drive signal via row decoders 76a and 76b, and also generates a sense amplifier activation signal for activating a sense amplifier in the memory array.

Although multiplexer 74 is provided at a preceding stage of address buffer 75 in the embodiment of FIG. 13, multiplexer 74 may be provided at the output side of address buffer 75.

The SDRAM further includes column select drive circuits 77a and 77b responsive to auto refresh detection signal AR for controlling a column select operation, and column decoders 78a and 78b activated in response to a column select enable signal /CE generated from column select drive circuits 77a and 77b for decoding a column address signal provided from a path not shown to generate a column select signal.

Column select drive circuits 77a and 77b inhibit the operation of column decoders 78a and 78b, respectively, when auto refresh detection signal AR attains an active state indicating that an auto refresh operation mode is specified. Thus, power consumption of the circuit associated with a column select operation in an auto refresh operation mode is reduced. Column select drive circuits 77a and 77b are provided in second control signal generation circuit 63 of FIG. 10.

FIG. 14 is a timing chart showing the state of an external control signal and an internal control signal in an auto-refresh mode. The refresh operation in an auto-refresh mode will be described according to FIGS. 13 and 14.

An auto refresh command is provided by setting external control signals ext./RAS and ext./CAS to an L level and external control signal ext./WE to an H level at a rising edge of clock signal CLK. In response to the provision of an auto refresh command, auto refresh detection circuit 70 renders auto refresh detection signal AR to an active state of an H level. Here, auto refresh detection circuit 70 increments the count value of address counter 71 by 1. Active control circuits 72a and 72b respond to bank address RBA from address counter 71 and auto refresh detection signal AR for generating internal RAS signal int.RAS (generally indicating internal RAS signals int.RASA and int.RASB).

When the bank address from address counter 71 specifies bank #1, an internal RAS signal int.RASA is generated from active control circuit 72a. When the bank address from bank address counter 71 indicates bank #2, active control circuit 72b is activated, whereby internal RAS signal int.RASB is generated in response to auto refresh detection signal AR.

A corresponding row select drive circuit 73a or 73b is activated in response to an internal RAS signal from active control circuit 72a or 72b to carry out a row select operation with respect to a selected bank (word line selection and sense amplifier drive).

Multiplexer 74 responds to auto refresh detection signal AR to select and provide to address buffer 75 the refresh address provided from address counter 71. Address buffer 75 responds to the refresh address from address counter 75 to generate an internal address which is provided to row decoders 76a and 76b. One of row decoders 76a and 76b is activated (by outputs of row select drive circuits 73a and 73b), whereby a corresponding row of memory cells in the specified bank is selected. A refresh operation of memory cells connected to the selected row is carried out.

Column select drive circuits 77a and 77b respond to auto refresh detection signal AR to set column select enable signal /CE to an inactive state of an H level. As a result, the decode operations of column decoders 78a and 78b are inhibited, so that a column select operation is not carried out.

At an elapse of a predetermined time period after input of an auto refresh command, auto refresh detection signal AR is rendered inactive and internal RAS signal int.RAS is also rendered inactive, whereby the row select operation in a selected bank is inhibited. The selected word line attains a de-selected state, and the sense amplifier is rendered inactive.

A similar operation is executed when the next auto refresh command is provided. Here, the count value of address counter 71 is incremented by 1. Bank address RBA is represented by the least significant bit of address counter 71. As a result, the bank is switched, and a refresh operation is carried out for a bank different from the prior bank. Thus, the auto refresh operation of FIG. 14 is realized.

A self refresh mode will be described hereinafter with reference to FIG. 15 showing the structure of the components associated with the self refresh mode of the SDRAM. The structure of FIG. 15 differs from that of FIG. 13 in that a self refresh detection circuit 80 and an internal oscillator 81 are provided instead of auto refresh detection circuit 70.

Self refresh detection circuit 80 makes determination of the state of external control signals ext./RAS, ext./CAS, ext./WE. ext.CKE and ext./CS at the rising edge of clock signal CLK to output a self refresh detection signal SR during the time period starting from specification of initiation of a self refresh mode up to specification of completion thereof. Internal oscillator 81 responds to an output of self refresh detection signal SR from self refresh detection circuit 80 to output a refresh signal Ref at a predetermined cycle.

FIGS. 16 and 17 are a block diagram showing a structure and a timing chart showing the operation, respectively, of internal oscillator 81. Referring to FIG. 16, internal oscillator 81 includes an oscillator 82, an NAND gate 83, a delay circuit 84, and an inverter 85. NAND gate 83, delay circuit 84 and inverter 85 form a pulse generator 86.

An output $\phi 82$ of oscillator 82 is applied to one input node of NAND gate 83. The output of NAND gate 83 is provided to the input of inverter 85, and also to the other input node of NAND gate 83 via delay circuit 84. The output of inverter 85 serves as a reset signal Ref.

As shown in FIG. 17, oscillator 82 oscillates at a predetermined cycle to output signal $\phi 82$ when self refresh detection signal SR attains an H level indicating that a self refresh mode is specified. Pulse generator 86 responds to a rise of signal $\phi 82$ to output signal Ref having a pulse width corresponding to a delay time of delay circuit 84.

FIG. 18 is a timing chart showing the state of an external control signal in a self refresh mode. The refresh operation in a self refresh mode will be described hereinafter with reference to FIGS. 15–18.

A start command of a self refresh mode is provided by setting external control signals ext.CKE, ext./CS, ext./RAS, and ext./CAS to an L level, and setting external control signal ext./WE to an H level at a rising edge of clock signal CLK.

In response to a provision of a start command of a self refresh operation, self refresh detection circuit 80 renders self refresh detection signal SR to an active state of an H level. In response, internal oscillator 81 renders reset signal Ref to an active state of an H level at a predetermined cycle. Internal oscillator 81 increments the count value of address counter 71 by 1 every time reset signal Ref attains an H level. Active control circuits 72a and 72b respond to bank address RBA from address counter 71 and refresh signal Ref to generate an internal RAS signal int.RAS. Thus, a refresh operation of banks #1 and #2 is carried out alternately every time refresh signal Ref attains an H level.

Multiplexer 74 responds to self refresh detection signal SR to select and provide to address buffer 75 a refresh address from address counter 71. Column select drive circuits 77a and 77b respond to a self refresh detection signal SR to set column select enable signal /CE to an inactive state of an H level, whereby the decode operations of column decoders 78a and 78b are inhibited.

A self refresh end command is provided by setting external control signals ext.CKE and ext./CS to an H level at a rising edge of clock signal CLK.

When a self refresh end command is provided, self refresh detection circuit 80 renders self refresh detection signal SR to an inactive state of an L level. In response, internal oscillator 81 ceases its output of refresh signal Ref, and a self refresh mode is terminated.

The present invention is advantageous in that the input and output margin of data to compensate for a skew (offset in timing) of an address does not have to be provided and the cycle time can be improved in contrast to a conventional DRAM operating in response to input of an address and data in synchronization with external control signals ext./RAS and ext./CAS. This is because the SDRAM operates in response to input of external control signals ext./RAS, ext./CAS, address signal Add, and data at the rising edge of a clock signal CLK. Some systems have a high probability of accessing several continuous bits. The average access time can be made equal to that of a static random access memory (SRAM) by improving this consecutive access time.

The time period responsive to a rising edge of clock signal CLK must be shortened in order to realize further improvement in the speed of operation in an SDRAM. An approach is proposed of incorporating a delay locked loop (referred to as DLL hereinafter) circuit in a chip for generating an internal clock signal int.CLK having a rising phase ahead of that of external clock signal ext.CLK and carrying out data input/output in response to the rising edge of that internal clock signal int.CLK.

FIG. 19 is a block diagram showing a structure of a conventional DLL circuit. Referring to FIG. 19, a DLL circuit includes clock buffers 91 and 96, a phase comparator 92, a charge pump 93, a loop filter 94, and a voltage control delay circuit 95.

As shown in FIG. 20, clock buffer 91 includes M (a positive integer) inverters 91.1–91.M connected in series to amplify external clock signal ext.CLK to output a clock signal ECLK. Clock signal ECLK is applied to phase comparator 92 and voltage control delay circuit 95. The size of the graphic representations of each of inverters 91.1–91.M in FIG. 20 implies the level of the load driving capability thereof. It is appreciated that the load driving capability of inverters 91.1–91.M gradually increases towards the output end. Each load driving capability of the succeeding stages of inverters 91.2–91.M is set approximately 3–4 times that of a preceding stage of inverters 91.1–91.M-1. The number of M of inverters 91.1–91.M is selected according to the capacitance of phase comparator 92 and voltage control delay circuit 95.

Referring to FIG. 21, clock buffer 96 includes N (a positive integer) inverters 96.1–96.N connected in series to amplify an output ECLK of voltage control delay circuit 95 to output internal clock signal int.CLK and clock signal RCLK. Internal clock signal int.CLK is supplied to the SDRAM as described before. Clock signal RCLK is provided to phase comparator 92. Similar to clock buffer 91, the load driving capability of inverters 96.1–96.N forming clock buffer 96 increases towards the output end. The number of N of inverters 96.1–96.N is selected according to the magnitude of the load capacitance. The inverter providing a clock signal RCLK (inverter 96.4 in the figure) is selected so that the phase difference between external clock signal ext.CLK and internal clock signal int.CLK takes a predetermined value.

Phase comparator 92 of FIG. 19 will be described with reference to the circuit diagram of FIG. 22. Referring to FIG. 22, phase comparator 92 includes inverters 100–104, 2-input NAND gates 105–110, 3-input NAND gates 111, 112, and a 4-input NAND gate 113.

Inverter 100 receives a clock signal ECLK from clock buffer 91. Inverter 101 receives clock signal RCLK from clock buffer 96. NAND gate 105 receives outputs of inverter 100 and NAND gate 111 to provide a signal φ105. NAND gate 106 receives outputs of NAND gates 105 and 107 to output a signal φ106. NAND gate 107 receives outputs of NAND gates 106 and 111, and NAND gate 108 receives outputs of NAND gates 109 and 113. NAND gate 109 receives outputs of NAND gates 108 and 110 to provide a signal φ109. NAND gate 110 receives outputs of inverter 101 and NAND gate 112 to provide a signal φ110.

NAND gate 113 receives signals φ105, φ106, φ109, and φ110 from NAND gates 105, 106, 109, and 110, respectively, to output a reset signal RES. NAND gate 111 receives signals φ105, φ106 and RAS from NAND gates 105, 106, and 113 to output an up signal /UP via inverters 102 and 103. NAND gate 112 receives signals φ109, φ110 and RES from NAND gates 109, 110 and 113, respectively, to output a down signal DOWN via inverter 104.

FIG. 23 is a timing chart of clock signal ECLK, clock signal RCLK, the output of 2-input NAND gate 105 (signal φ105), the output of 2-input NAND gate 110 (signal φ110), the output of 4-input NAND gate 113 (reset signal RAS), up signal /UP and down signal DOWN.

Prior to a description according to FIGS. 22 and 23, the case where both clock signals ECLK and RCLK attain an H level is considered. In this case, gates 105 and 110 always output a signal of an H level. If outputs of gates 106 and 109 attain an H level, the output of gate 113 is pulled down to an L level, and the outputs of gates 107 and 108 are pulled up to an H level, whereby the outputs of gates 106 and 109 eventually attain an L level. This means that gates 111 and 112 always output a signal of an H level as long as both clock signals ECLK and RCLK attain an H level. When clock signals ECLK and RCLK then are pulled down to an L level, the outputs of gates 105 and 110 attain an L level, and the gates of 106 and 109 attain an H level.

As shown in FIG. 23, the case will be described where clock signal ECLK first rises, and then clock signal RCLK rises with a delay of just the phase of T1. In response to a rise of clock signal ECLK, output φ105 of gate 105 is pulled up to an H level. However, since clock signal RCLK still remains at the L level, output φ110 of gate 110 is maintained at the L level, and output RES of gate 113 does not change its level of H. As a result, the output of gate 111 is pulled down to an L level. The output of gate 112 remains at the H level.

Then, when clock signal RCLK rises, output φ110 of gate 110 is pulled up to an H level, whereby all the 4 inputs of gate 113 attain an H level and output RES of gate 113 is pulled down to an L level. In response, the output of gate 111 is pulled up again to an H level from the L level, and gate 111 provides a pulse signal reflecting the phase difference of clock signal ECLK and clock signal RCLK. In contrast, the output of gate 112 is pulled down to an L level in response to the output of gate 110 attaining an H level, and then immediately returns to an H level in response to the output of gate 113 attaining an L level. Therefore, gate 112 provides a pulse signal of a constant width irrespective of the phase difference between clock signal ECLK and clock signal RCLK.

When clock signal RCLK falls and then clock signal ECLK rises, a similar operation is carried out provided that the relationship between up signal /UP and down signal DOWN is reversed.

More specifically, as shown in FIG. 24, phase comparator 92 provides an up signal /UP of a constant pulse width and a down signal DOWN of a pulse width according to the phase difference when the phase of clock signal ECLK is behind that of clock signal RCLK, provides an up signal /UP and a down signal DOWN of the same pulse width when the phase of clock signal ECLK matches that of RCLK, and provides a down signal DOWN of a constant pulse width and an up signal /UP of a pulse width according to the phase difference when the phase of clock signal ECLK is ahead of that of clock signal RCLK.

FIG. 25 is a circuit diagram showing structures of charge pump 93 and loop filter 94 of FIG. 19. Referring to FIG. 25, charge pump 93 includes a constant current source 123 connected in series between a power supply potential line 121 and the ground potential line 122, a P channel MOS transistor 124, an N channel MOS transistor 125, and a constant current source 126. The gate of P channel MOS transistor 124 receives up signal /UP, and the gate of N channel MOS transistor 125 receives a down signal DOWN. A node N124 of P and N channel MOS transistors 124 and 125 serves as the output node of charge pump 93. Loop filter 94 includes a resister 127 and a capacitor 128 connected in series between output node N124 of charge pump 93 and a ground potential line 122.

The operation of charge pump 93 and loop filter 94 of FIG. 25 will be described hereinafter. When up signal /UP and down signal DOWN both attain an L level, P channel MOS transistor 124 is rendered conductive, and N channel MOS transistor 125 is rendered non-conductive, whereby charge is supplied to capacitor 128 via power supply potential line 121 → constant current source 123 → P channel MOS transistor 124 → node N124 → resistor 127. As a result, the voltage of node N124, i.e., control voltage VCOin gradually increases.

Conversely, when up signal /UP and down signal DOWN both attain an H level, P channel MOS transistor 124 is rendered non-conductive, and N channel MOS transistor 125 is rendered conductive, whereby the charge of capacitor 128 flows out via a path of capacitor 128 → resistor 127 → node N124 → N channel MOS transistor 125 → constant current source 126 → ground potential line 122. As a result, control voltage VCOin gradually drops.

When up signal /UP attains an L level and down signal DOWN attains an H level, MOS transistors 124 and 125 are both rendered conductive, whereby the amount of charge flowing into node N124 and the amount of charge flowing out from node N124 become equal. Therefore, there is no change in control voltage VCOin.

When up signal /UP attains an H level and down signal DOWN attains an L level, MOS transistors 124 and 125 are both rendered non-conductive, whereby node N124 attains a floating state. Therefore, there is no change in control voltage VCOin.

Thus, control voltage VCOin which is the output of charge pump 93 and loop filter 94 gradually drops when the phase of clock signal ECLK is behind that of clock signal RCLK, shows no change when the phase of clock signal ECLK matches that of RCLK, and gradually increases when the phase of clock signal ECLK is ahead than that of clock signal RCLK.

FIG. 26 is a circuit diagram of a structure of voltage control delay circuit 95 of FIG. 19 with a portion thereof omitted. Referring to FIG. 26, voltage control delay circuit 95 includes a bias generation circuit 130, and K (a positive integer) delay time variable elements 140.1–140.K connected in series.

Bias generation circuit 130 includes P channel MOS transistors 131, 132 and N channel MOS transistors 133, 134. P channel MOS transistor 131 and N channel MOS transistor 133 are connected in series between power supply potential line 121 and ground potential line 122. P channel MOS transistor 132 and N channel MOS transistor 134 are connected in series between power supply potential line 121 and ground potential line 122. P channel MOS transistors 131 and 132 have their gates connected in common and also to the drain of P channel MOS transistor 131. More specifically, P channel MOS transistors 131 and 132 form a current mirror circuit. The gate of N channel MOS transistor 133 receives control voltage VCOin. N channel MOS transistor 134 has its gate connected to the drain thereof.

A current Ia increasing/decreasing according to control voltage VCOin is supplied to N channel transistor 133. The same current Ia flows towards the four MOS transistors 131–134 since MOS transistors 133 and 131 are connected in series, MOS transistors 131 and 132 form a current mirror circuit, and MOS transistors 132 and 134 are connected in series. It is to be assumed that the size of MOS transistors 131 and 132 are equal.

Delay time variable element 140.1 includes P channel MOS transistors 141.1, 142.1 and N channel MOS transistors 143.1, 144.1 connected in series between power supply potential line 121 and ground potential line 122. P channel MOS transistor 141.1 has its gate connected to the gate of P channel MOS transistor 132 of bias generation circuit 130. MOS transistors 142.1 and 143.1 have their gates connected in common. MOS transistors 142.1 and 143.1 form inverter 145.1. N channel MOS transistor 144.1 has its gate connected to the gate of N channel MOS transistor 134 of bias generation circuit 130. The remaining delay time variable elements 140.2–140.K have a similar structure. Inverters 145.1–145.K are connected in series. Inverter 145.1 receives a clock signal ECLK, and inverter 145.K outputs a clock signal ECLK.

The operation of voltage control delay circuit 94 of FIG. 26 will be described hereinafter. P channel MOS transistors 141.1–141.K have their gates both connected to the gate of P channel MOS transistor 132, and N channel MOS transistors 144.1–144.K have their gates both connected to the gate of N channel MOS transistor 134. Therefore, a current Ia corresponding to control voltage VCOin flows towards each of delay time variable elements 140.1–140.K.

When current Ia increases in response to a higher control voltage VCOin, the inversion time period of each of inverters 145.1–145.K is shortened to reduce the delay time of voltage control delay circuit 95.

When current Ia is reduced in response to a lower control voltage VCOin, the inversion time of each of inverters 145.1–145.K is lengthened to increase the delay time of voltage control delay circuit 95.

The operation of the DLL circuit of FIG. 19 will be described hereinafter. When the phase of clock signal RCLK is behind that of clock signal ECLK, phase comparator 92 provides up signal /UP of a pulse width according to the phase difference between clock signals ECLK and RCLK, and a down signal DOWN of a predetermined pulse width. In response, charge pump 93 supplies charge to loop filter 94, whereby control voltage VCOin rises to shorten the delay time of voltage control delay circuit 95. Therefore, the phase of clock signal RCLK advances, and the phase difference between clock signals ECLK and RCLK becomes smaller.

When the phase of clock signal RCLK is ahead of clock signal ECLK, phase comparator 92 provides a down signal DOWN of a pulse width according to the phase difference between clock signals RCLK and ECLK, and an up signal /UP of a predetermined pulse width. In response, charge flows out from loop filter 94 towards charge pump 93, whereby control voltage VCOin drops to increase the delay time of voltage control delay circuit 95. Therefore, the phase of clock signal RCLK is delayed, and the phase difference between clock signals RCLK and ECLK becomes smaller.

By repeating the above procedure, the phase of clock signal RCLK matches that of signal ECLK. As shown in FIG. 27, an internal clock signal int.CLK having a phase ahead by a desired value than that of external clock signal ext.CLK is output from clock buffer 96.

In the above SDRAM in which a conventional DLL circuit is incorporated, internal clock signal int.CLK is continuously output as long as external clock signal ext.CLK is applied even in a mode where internal clock signal int.CLK is not required such as in a refresh mode. There was the problem that current is consumed wastefully in the DLL circuit.

SUMMARY OF THE INVENTION

In view of the foregoing, a main object of the present invention is to provide a synchronous semiconductor memory device of low power consumption.

A synchronous semiconductor memory device of the present invention includes a control circuit for inhibiting input of an external clock signal to a control voltage generation circuit and a delay circuit for a predetermined time period according to specification of a mode asynchronous to an internal clock signal. Generation of an internal clock signal can be prevented in a mode that does not require an internal clock signal. Therefore, power consumption can be reduced.

The control circuit includes a first signal generation circuit for providing an auto refresh detection signal in response to specification of an auto-refresh mode, and a first gate circuit responsive to an auto refresh detection signal for inhibiting input of an external clock signal to a control voltage generation circuit and a delay circuit. Therefore, generation of an internal clock signal in an auto-refresh mode can be prevented.

The control circuit further includes a second signal generation circuit for providing a self refresh detection signal according to specification of a self refresh mode, and a second gate circuit responsive to a self refresh detection mode for inhibiting input of an external clock signal to a control voltage generation circuit and a delay circuit. Therefore, generation of an internal clock signal in a self refresh mode can be prevented.

According to another aspect of the present invention, the control circuit includes a first signal generation circuit for providing an auto refresh detection signal according to specification of an auto-refresh mode, a second signal generation circuit for providing a self refresh detection mode according to specification of a self refresh mode, and a first gate circuit responsive to an auto refresh detection signal or a self refresh detection signal for inhibiting input of an external clock signal to a control voltage generation circuit and a delay circuit. Therefore, generation of an internal clock signal in an auto-refresh mode and a self refresh mode can be prevented.

The control circuit includes a third signal generation circuit for providing an activation signal at a predetermined cycle according to specification of a self refresh mode, and a third gate circuit responsive to an activation signal for providing an external clock signal to a control voltage generation circuit and a delay circuit, whereby an internal clock signal can be generated intermittently in a self refresh mode. As a result, reduction in power consumption and the recovery time after completion of a self refresh operation can be reduced.

The third gate circuit responds to an activation signal to provide an external clock signal to a delay circuit, and then provide an internal clock from the delay circuit and an external clock to the control voltage generation circuit, whereby the control voltage generation circuit can operate stably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
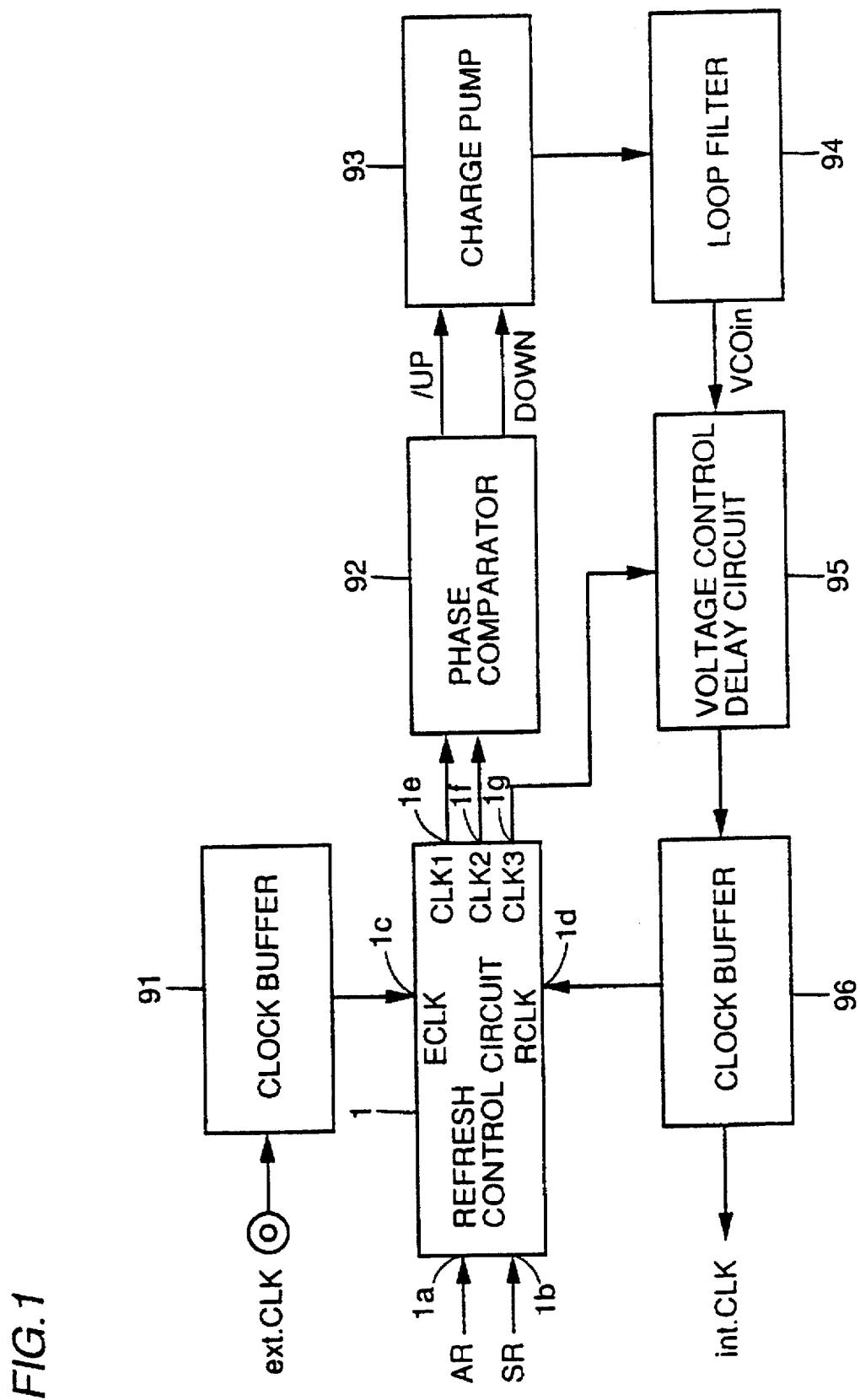
FIG. 1 is a block diagram showing a structure of a DLL circuit in an SDRAM according to a first embodiment of the present invention.
Figure 19:
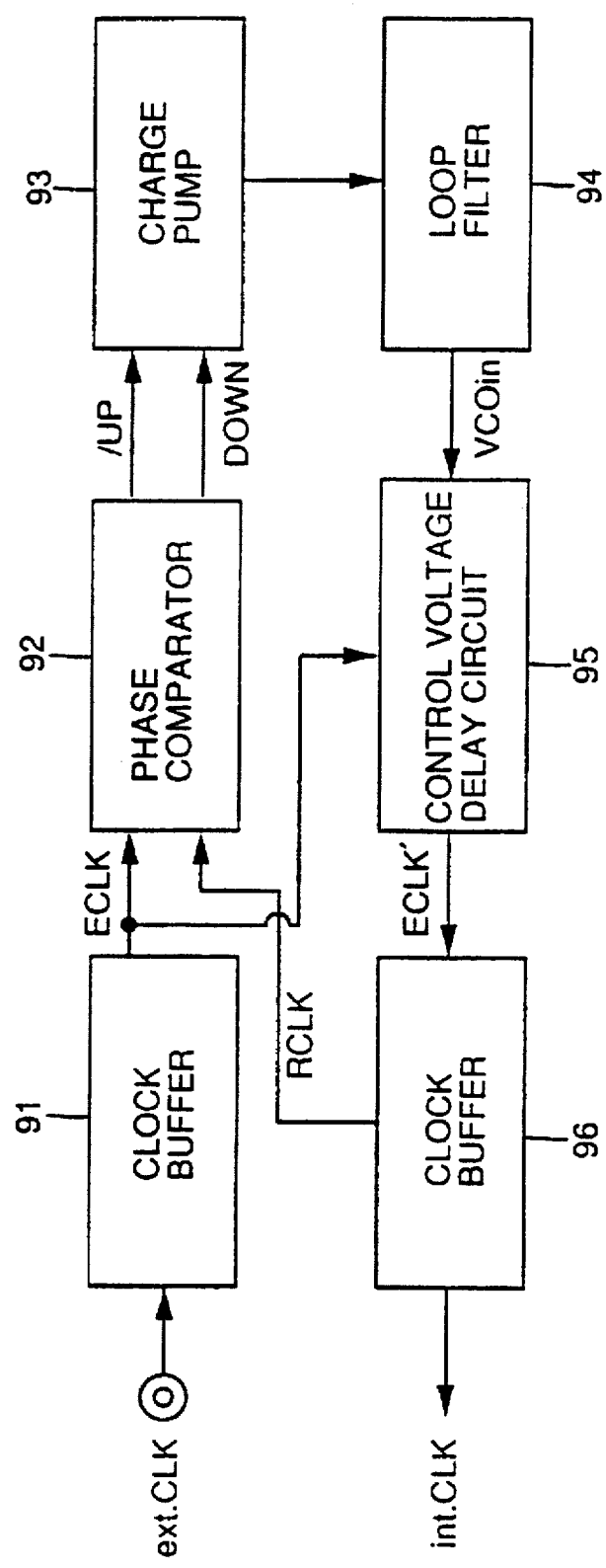
FIG. 19 is a block diagram showing a structure of a conventional DLL circuit.
Figure 20:
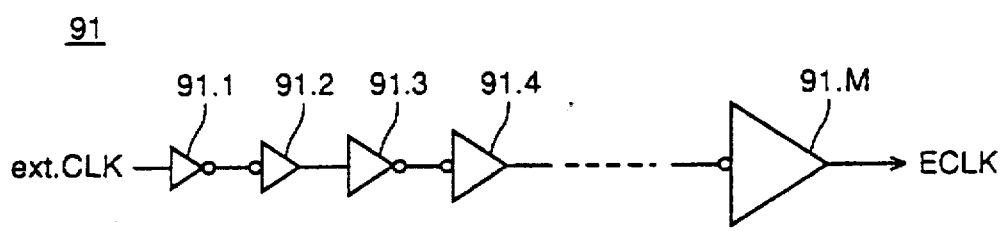
FIG. 20 is a circuit diagram showing a structure of a clock buffer 91 of the DLL circuit of FIG. 19 with a portion thereof omitted.
Figure 21:
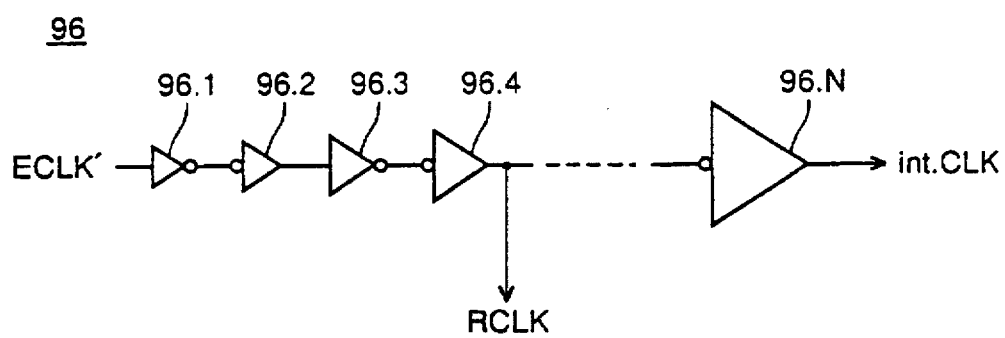
FIG. 21 is a circuit diagram showing a structure clock buffer 96 of the DLL circuit of FIG. 19 with a portion thereof omitted.
Figure 22:
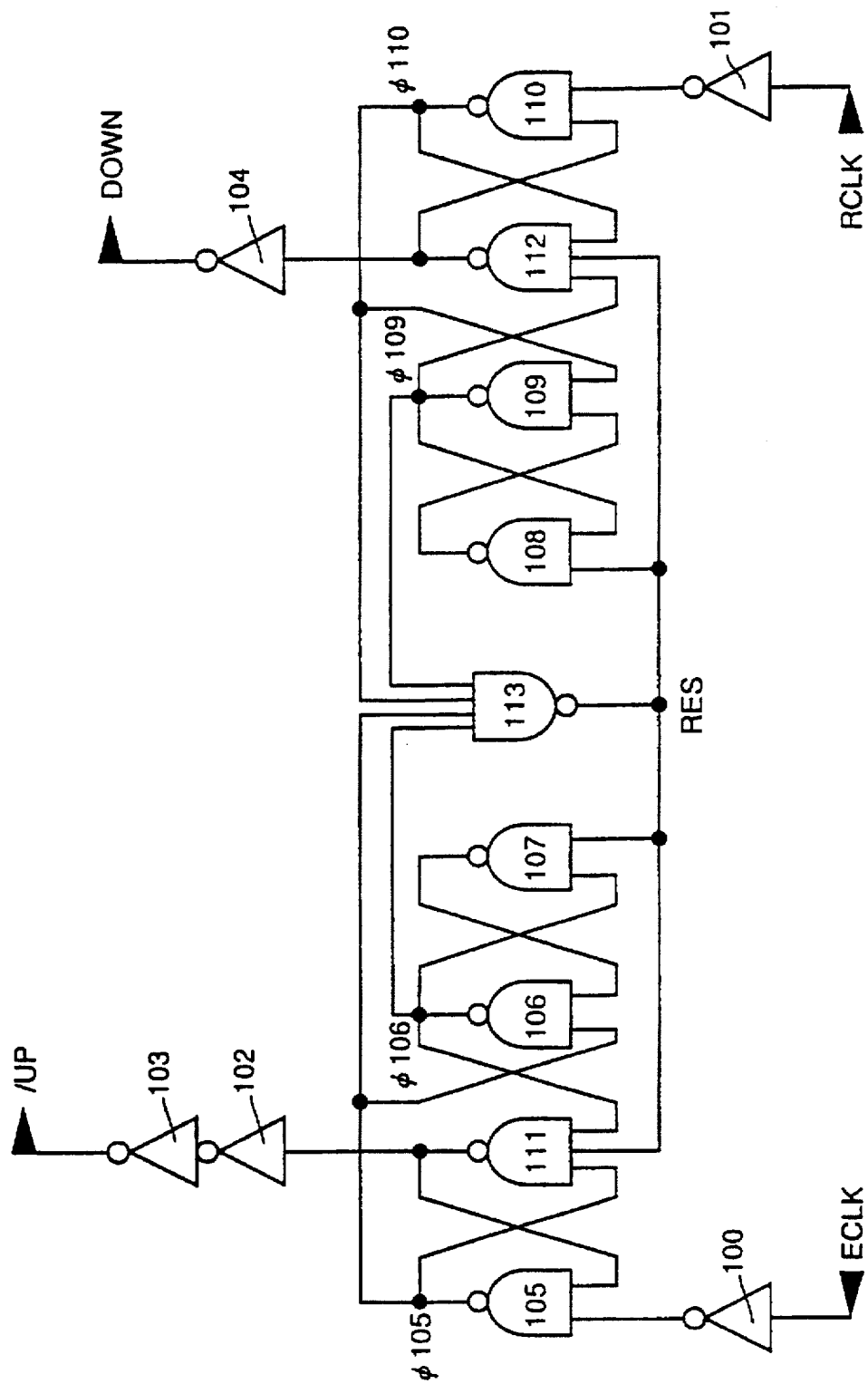
FIG. 22 is a circuit diagram showing a structure of a phase comparator of the DLL circuit of FIG. 19.
Figure 23:
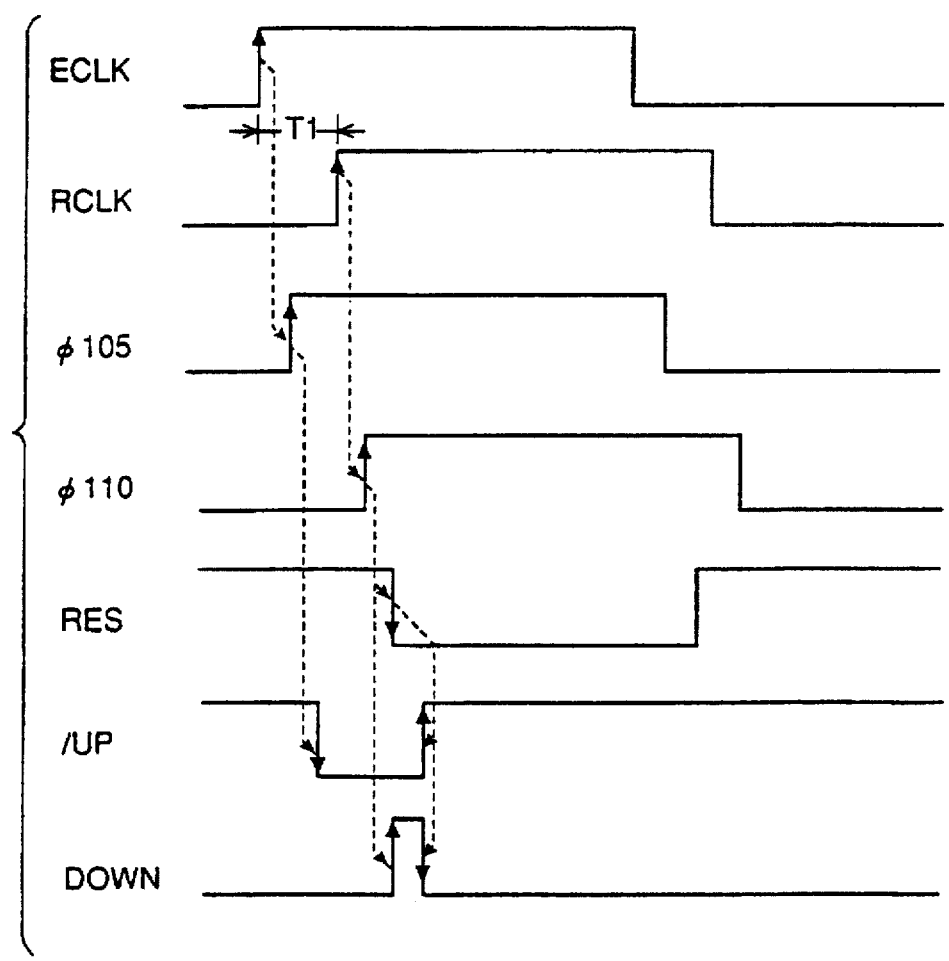
FIGS. 23 and 24 are timing charts showing an operation of the phase comparator of FIG. 22.
Figure 24:
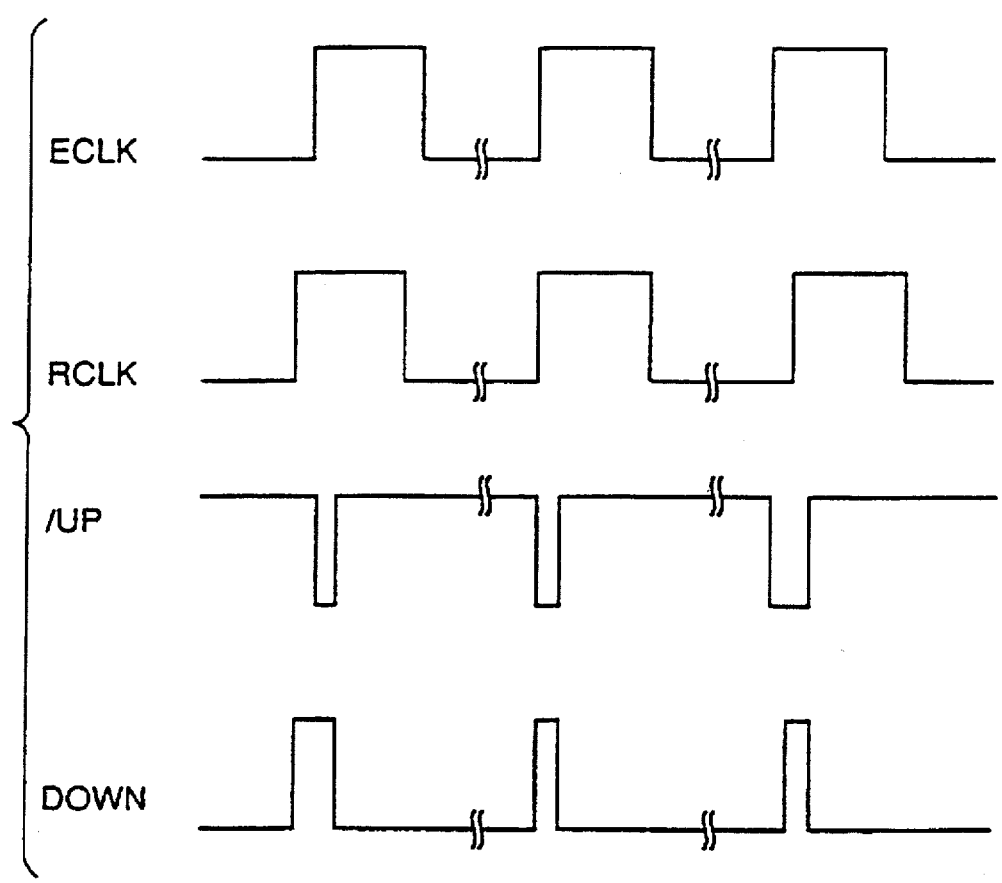

FIG. 1 is a block diagram showing a structure of a DLL circuit of an SDRAM according to a first embodiment of the present invention. The DLL circuit of FIG. 1 differs from the DLL circuit shown in FIG. 19 in that a refresh control circuit 1 is additionally provided.

Figure 2:
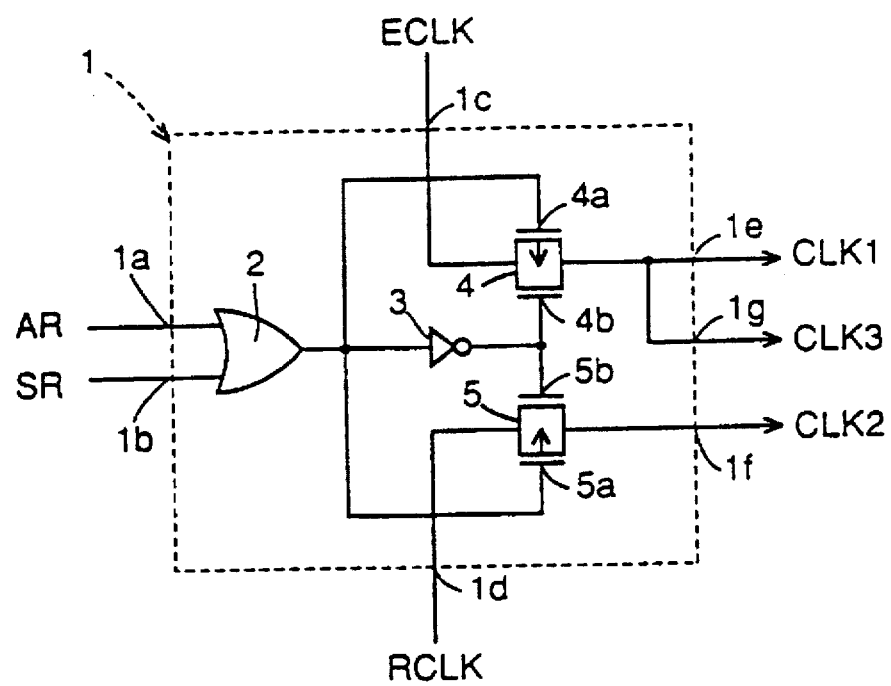
FIG. 2 is a circuit diagram showing a structure of a refresh control circuit in the DLL circuit of FIG. 1.

Referring to FIG. 2, a refresh control circuit 1 includes control signal input terminals 1a, 1b, clock signal input terminals 1c, 1d, and clock signal output terminals 1e, 1g, 1f. An auto refresh detection signal AR from an auto refresh detection circuit 70 is applied to control signal input terminal 1a. A self refresh detection signal SR from a self refresh detection circuit 80 is applied to control signal input terminal 1b. A clock signal ECLK from a clock buffer 91 is applied to clock signal input terminal 1c. A clock signal RCLK from a clock buffer 96 is applied to clock signal input terminal 1d. Clock signals CLK 1, CLK 2, and CLK 3 are provided from clock signal output terminals 1e, 1f, and 1g, respectively. Clock signals CLK 1 and CLK 2 are applied to phase comparator 92. Clock signal CLK 3 is applied to a voltage control delay circuit 95.

Refresh control circuit 1 further includes an OR gate 2, an inverter 3, and transfer gates 4, 5. Transfer gate 4 is connected between clock signal input terminal 1c and clock signal output terminal 1e. Clock signal output terminals 1e and 1g are connected in common. Transfer gate 5 is connected between clock signal input terminal 1d and clock signal output terminal 1f. OR gate 2 receives auto refresh detection signal AR and self refresh detection signal SR via control signal input terminals 1a and 1b, respectively. The output of OR gate 2 is directly applied to gates 4a and 5a of transfer gates 4 and 5 at the P channel MOS transistor side, and also to gates 4b and 5b at the side of the N channel MOS transistor of transfer gates 4 and 5 via an inverter 3.

The operation will be described hereinafter.

When auto refresh detection signal AR and self refresh detection signal SR both attain an inactive state of an L level, OR gate 2 provides a signal of an L level, whereby transfer gates 4 and 5 conduct. This causes clock signal ECLK from clock buffer 91 to be applied to phase comparator 92 and voltage control delay circuit 95, and a clock signal RCLK from clock buffer 96 to be applied to phase comparator 92. Thus, the DLL circuit operates.

When auto refresh detection signal AR or self refresh detection signal SR attains an active state of an H level, OR gate 2 provides a signal of an H level, whereby transfer gates 4 and 5 are cut off. As a result, input of clock signals ECLK and RCLK from clock buffers 91 and 96 to phase comparator 92 and voltage control delay circuit 95, respectively, is inhibited. Therefore, the DLL circuit does not operate.

Power consumption in a refresh mode can be reduced since the operation of the DLL circuit is ceased in response to specification of an auto-refresh mode or a self refresh mode that does not need an internal clock signal int.CLK according to the present invention.

Although internal clock signal int.CLK is generated by the DLL circuit, a structure may be provided in which internal clock signal int. CLK is generated by a phase locked loop (referred to as PLL hereinafter), which is inhibited in operation in response to auto refresh detection signal AR or self refresh detection signal SR.

Embodiment 2

Figure 25:
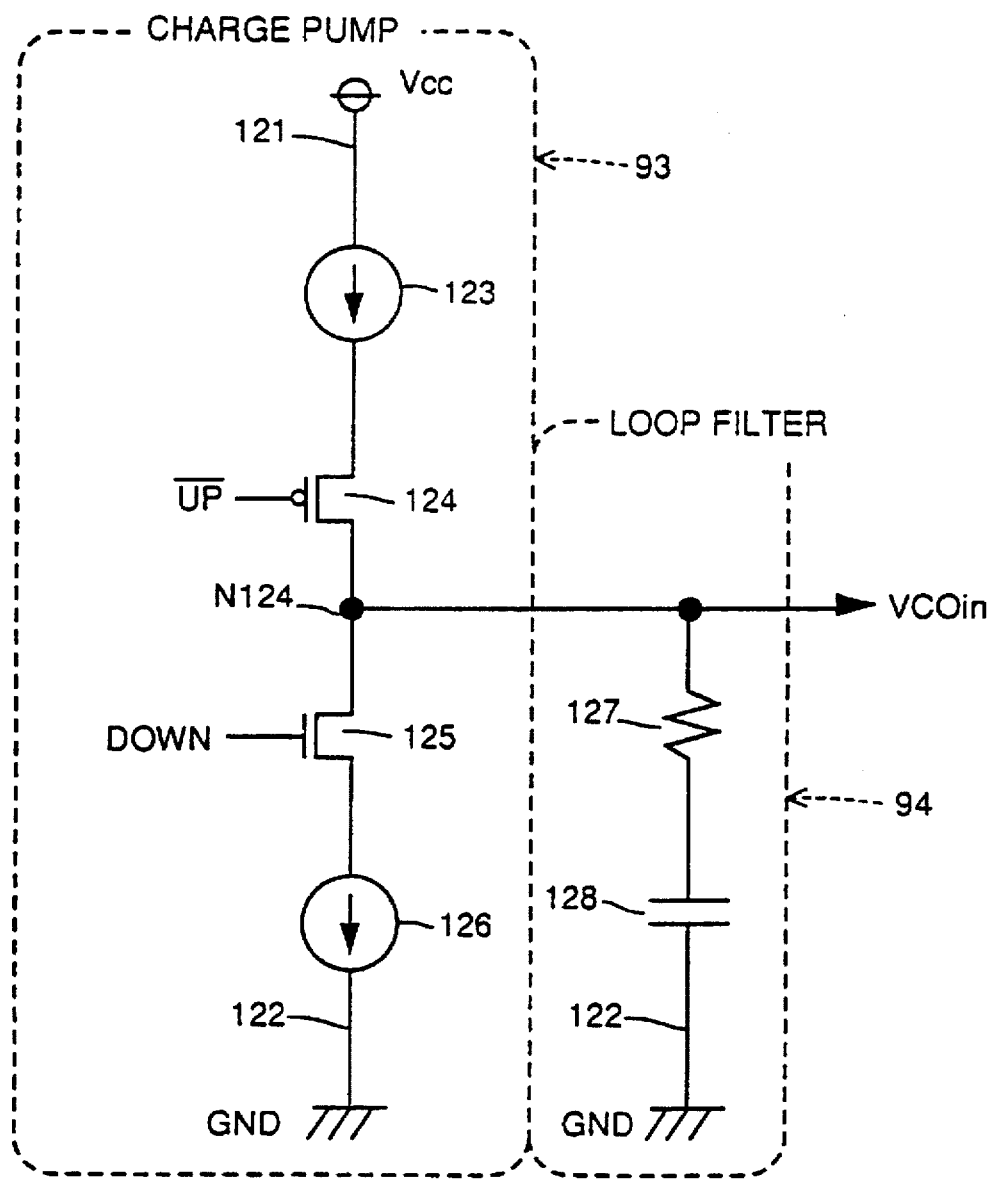
FIG. 25 is a circuit diagram showing a structure of a charge pump and a loop filter of the DLL circuit of FIG. 19.
Figure 26:
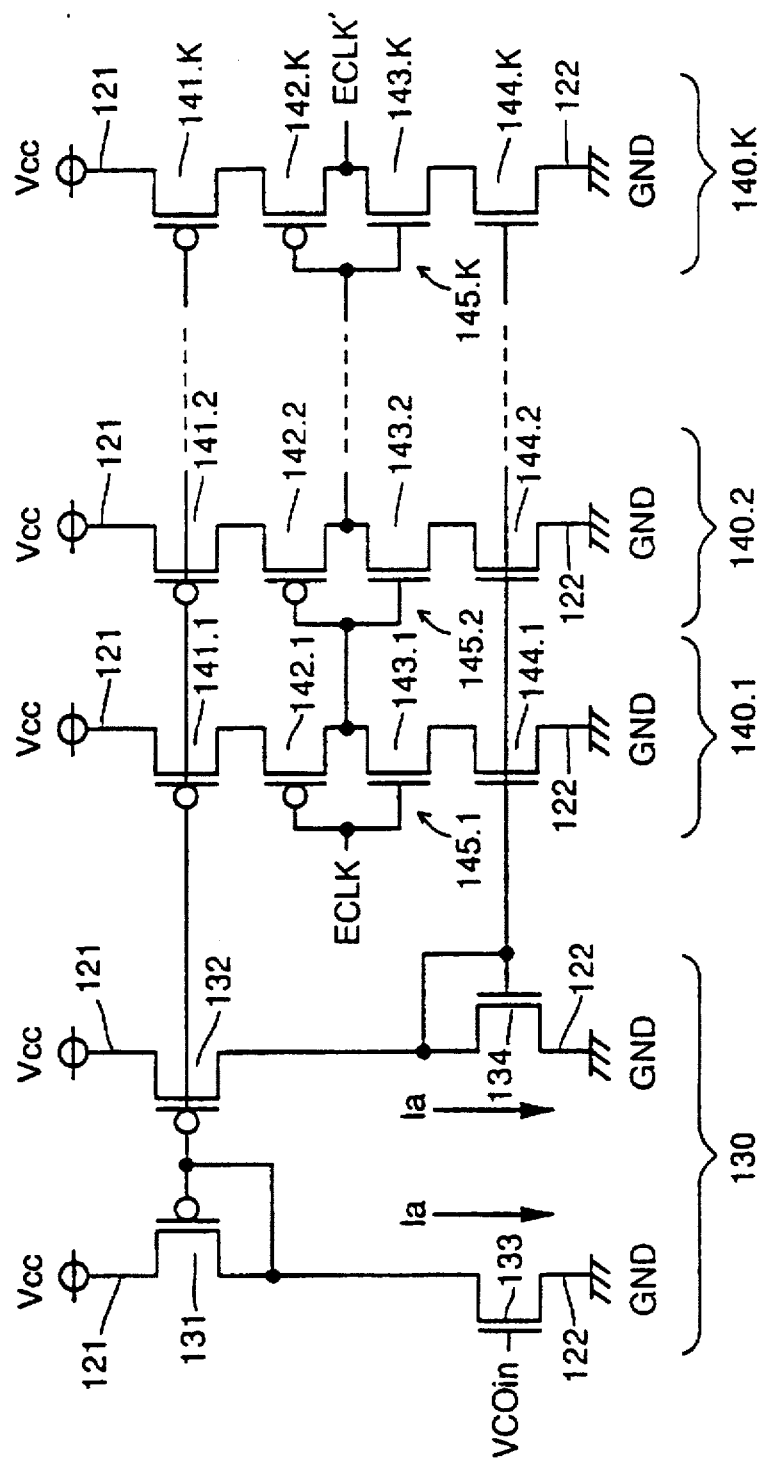
FIG. 26 is a circuit diagram showing a structure of the voltage control delay circuit of FIG. 19 with a portion thereof omitted.
Figure 27:
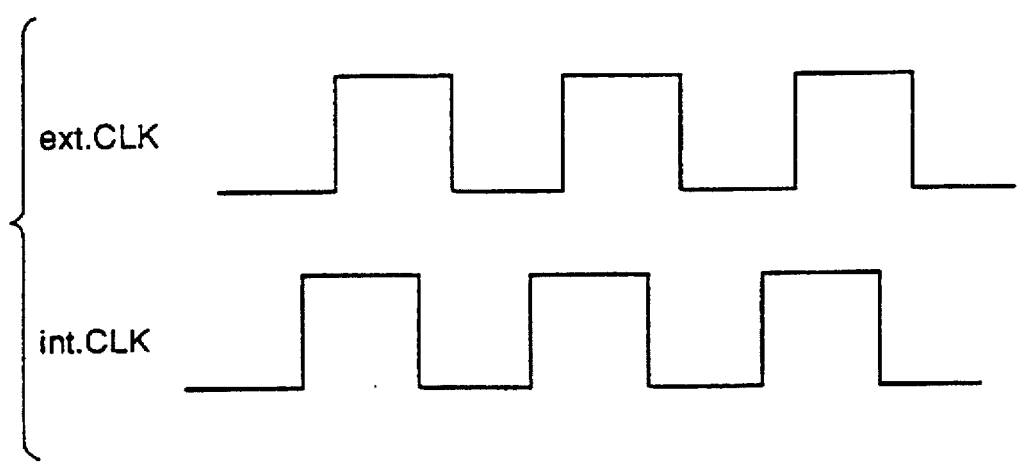
FIG. 27 is a chart showing an operation of the DLL circuit of FIG. 19.

In the prior first embodiment, the DLL circuit was completely disabled in an auto-refresh mode or a self refresh mode. When the duration of a self refresh mode is appreciable, output voltage VCOin of charge pump 93 and loop filter 94 shown in FIG. 25 will change during the halt of the DLL circuit, so that the DLL circuit becomes out of synchronization. This means that the recovery time before a general operation is allowed after termination of a self refresh mode becomes longer. In the present embodiment, the recovery time after termination of a self refresh mode is reduced by operating the DLL circuit intermittently in a self refresh mode.

Figure 3:
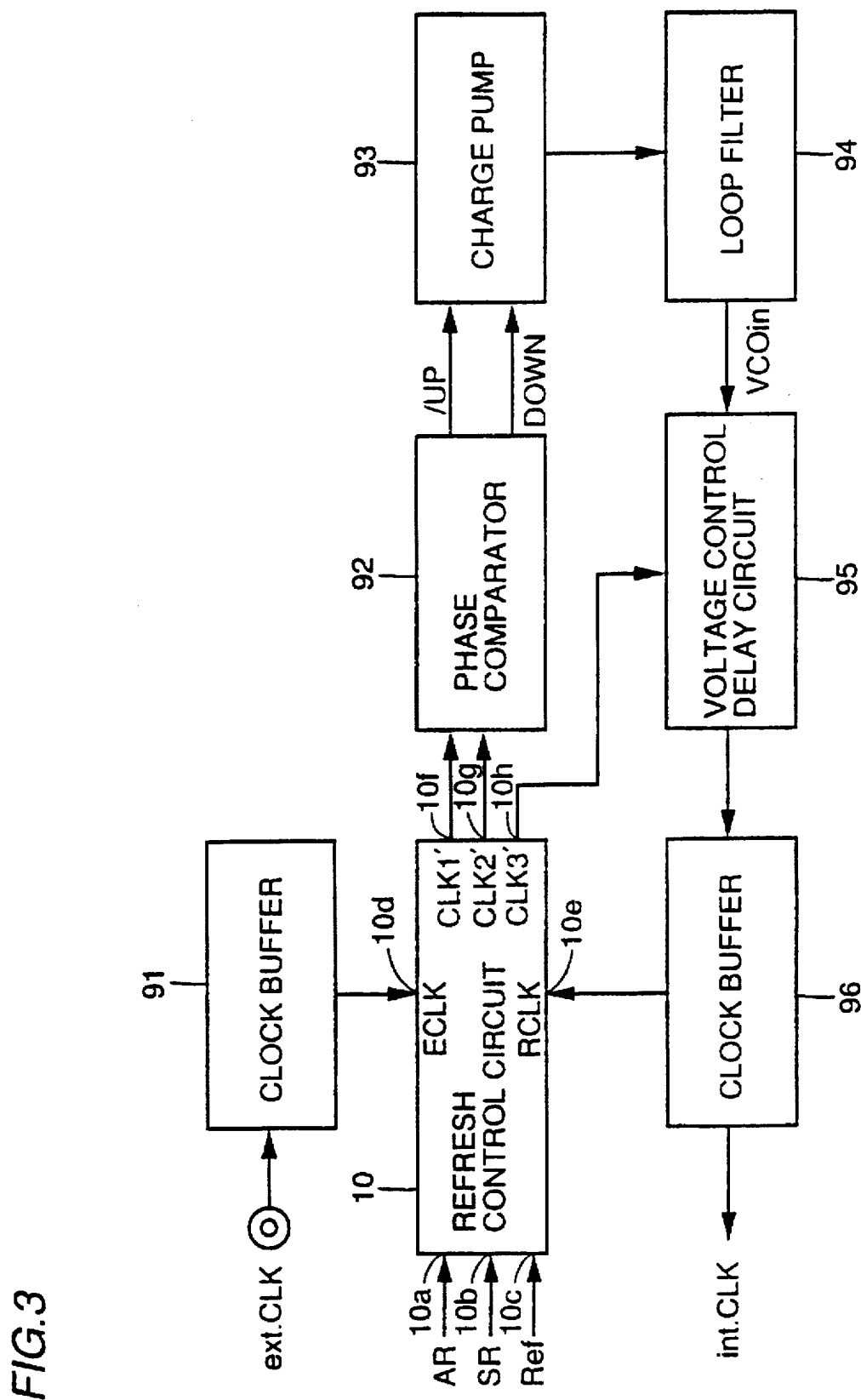
FIG. 3 is a block diagram showing a structure of a DLL circuit in an SDRAM according to a second embodiment of the present invention.

FIG. 3 shows a structure of a DLL circuit of an SDRAM according to a second embodiment of the present invention. The DLL circuit of FIG. 3 differs from the DLL circuit of FIG. 1 in that a refresh control circuit 10 is provided instead of refresh control circuit 1.

Figure 4:
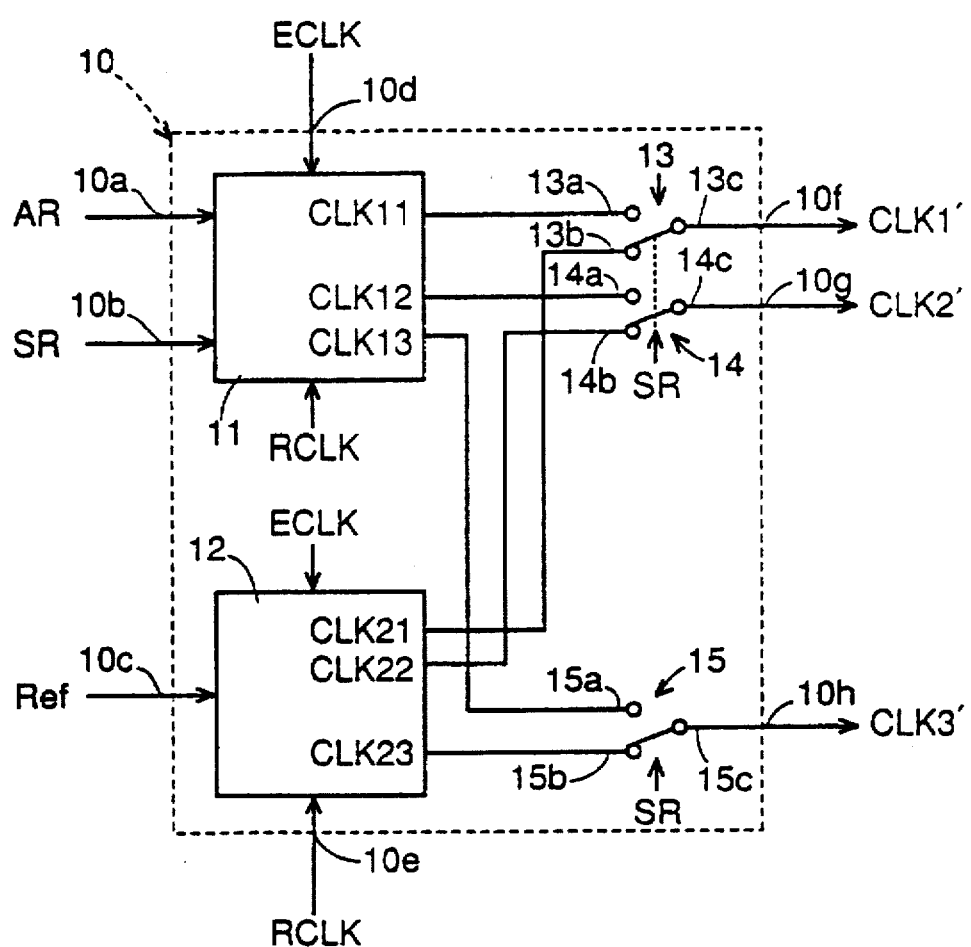
FIG. 4 is a circuit block diagram showing a structure of a refresh control circuit in the DLL circuit of FIG. 3.
Figure 15:
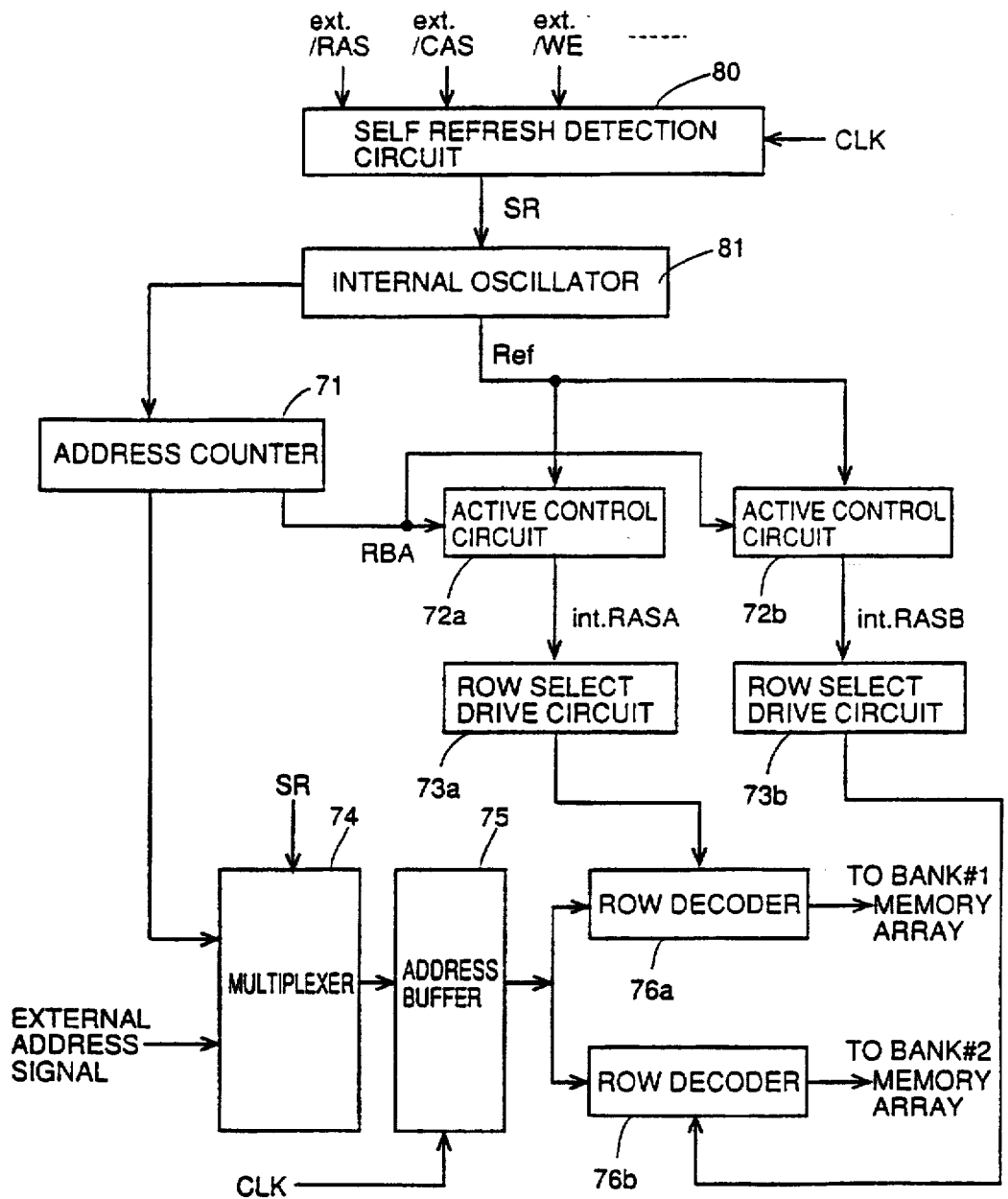
FIG. 15 is a block diagram showing a structure of the components of the SDRAM of FIG. 10 associated with a self refresh mode.
Figure 15:
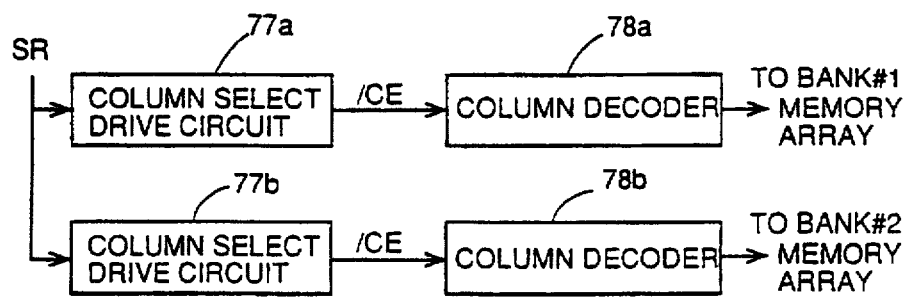
Figure 16:
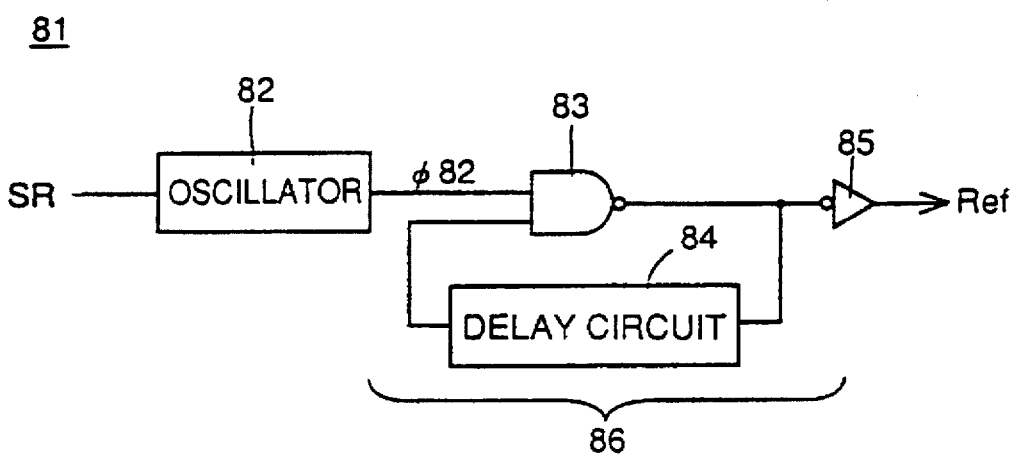
FIG. 16 is a circuit block diagram showing a structure of an internal oscillator of the portion associated with the self refresh mode of FIG. 15.
Figure 17:
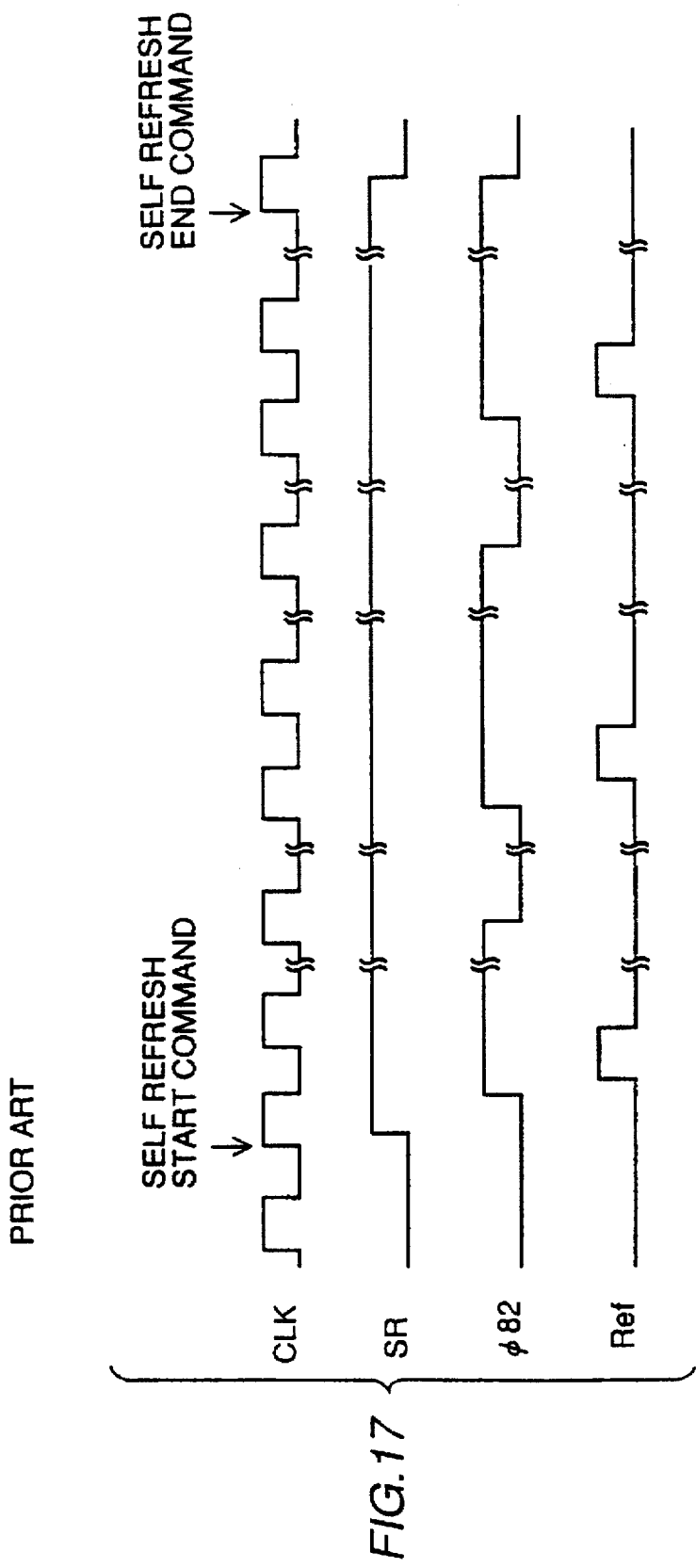
FIG. 17 is a timing chart showing an operation of the internal oscillator of FIG. 16.
Figure 18:
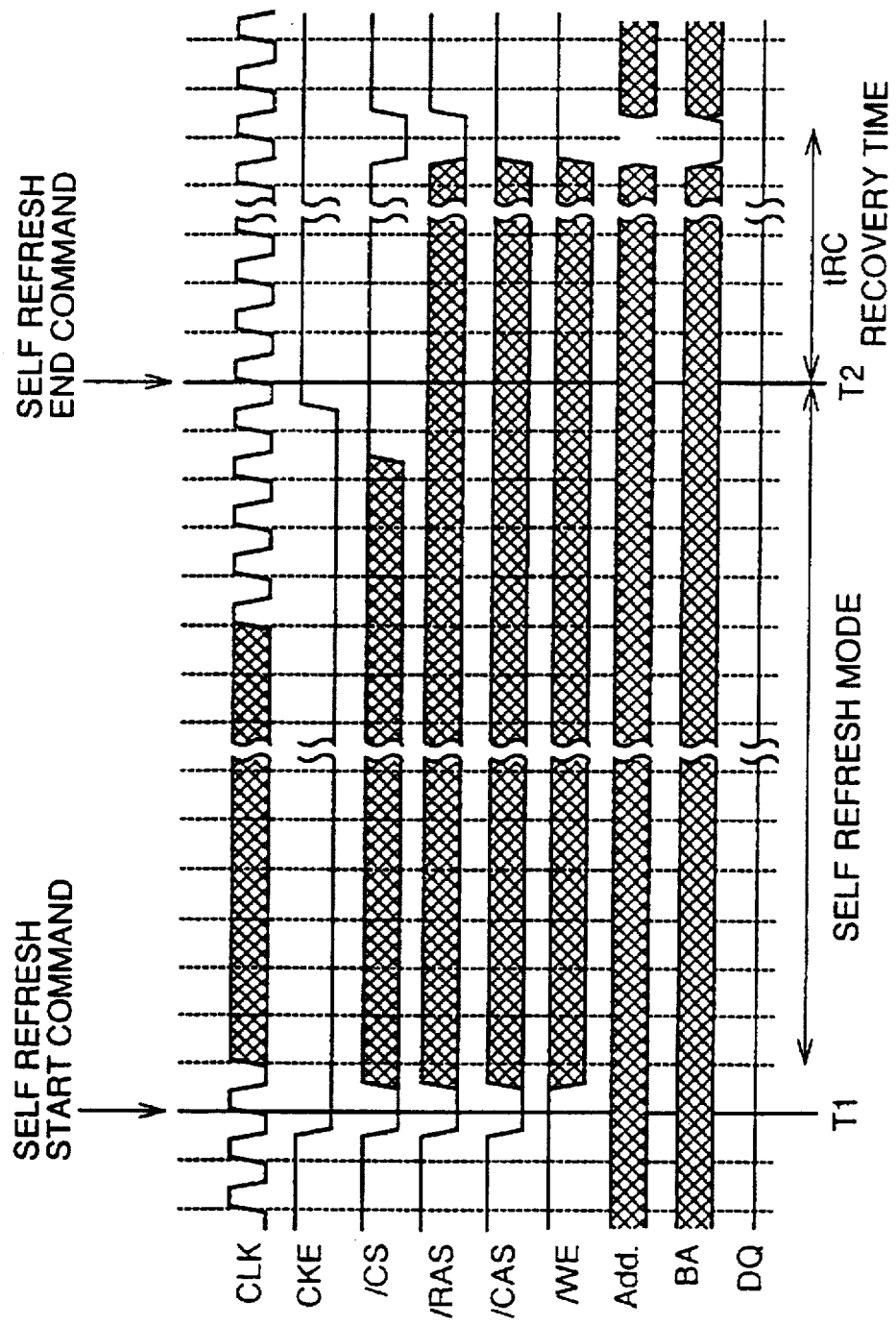
FIG. 18 is a timing chart showing an operation of the portion associated with a self refresh mode of FIG. 15.

Referring to FIG. 4, refresh control circuit 10 includes control signal input terminals 10a, 10b, 10c, clock signal input terminals 10d, 10e, and clock signal output terminals 10f, 10g, 10h. Auto refresh detection signal AR from auto refresh detection circuit 70 is applied to control signal input terminal 10a. Self refresh detection signal SR from self refresh detection circuit 80 is applied to control signal input terminal 10b. Refresh signal Ref from internal oscillator 81 shown in FIG. 15 is applied to control signal input terminal 10c. Clock signal ECLK from clock buffer 91 is applied to clock signal input terminal 10d. Clock signal RCLK from clock buffer 96 is applied to clock signal input terminal 10e. Clock signals CLK 1', CLK 2', and CLK 3' are provided from clock signal output terminals 10e, 10f, and 10g, respectively. Clock signals CLK 1' and CLK 2' are applied to phase comparator 92. Clock signal CLK 3' is applied to voltage control delay circuit 95.

Refresh control circuit 10 includes gate circuits 11 and 12, and 2-contact switches 13, 14, 15. Gate circuits 11 receives auto refresh detection signal AR, self refresh detection signal SR, and clock signals ECLK and RCLK from input terminals 10a, 10b, 10d, and 10e, respectively, to provide clock signals CLK 11, CLK 12 and CLK 13. The structure and operation of gate circuit 11 are similar to those of refresh control circuit 1 of FIG. 2. More specifically, gate circuit 11 passes through clock signals ECLK and RCLK when auto refresh detection signal AR or self refresh detection signal SR attains an inactive state of an L level. Clock signal ECLK passing through clock circuit 11 results in clock signals CLK 11 and CLK 13, and clock signal RCLK passing through gate circuit 11 results in clock signal CLK 12. Gate circuit 11 prevents passage of clock signals ECLK and RCLK when either auto refresh detection signal AR or self refresh detection signal SR attains an active state of an H level.

Gate circuit 12 receives refresh signal Ref and clock signals ECLK and RCLK from input terminals 10c, 10d, and 10e, respectively, to provide clock signals CLK 21, CLK 22, and CLK 23. Gate circuit 12 prevents passage of clock signals ECLK and RCLK when refresh signal Ref attains an inactive state of an L level. Gate circuit 12 first passes clock signal ECLK when clock signal Ref attains an active state of an H level. Clock signal ECLK passed through is output as clock signal CLK 23. Clock signal CLK 23 becomes a clock signal RCLK delayed by just 1 clock by voltage control delay circuit 95 and clock buffer 96 shown in FIG. 3. Gate circuit 12 allows passage of clock signals ECLK and RCLK when clock signal RCLK is fed back. The passed clock signals ECLK and RCLK are output as clock signals CLK 21 and CLK 22.

Figure 5:
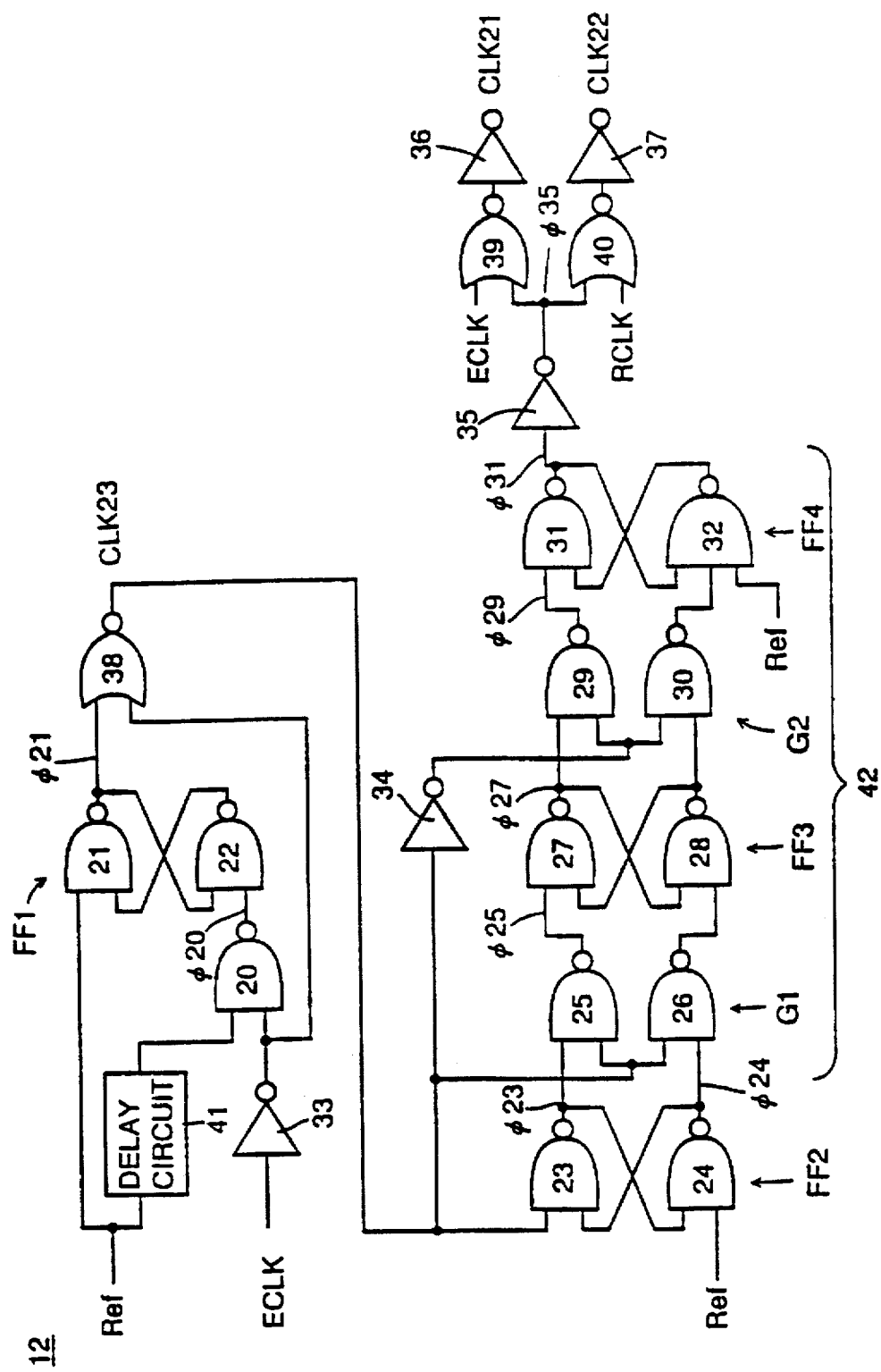
FIG. 5 is a circuit diagram showing a structure of a gate circuit 12 of the refresh control circuit of FIG. 4.

Referring to FIG. 5, gate circuit 12 includes 2-input NAND gates 20–31, a 3-input NAND gate 32, inverters 33–37, 2-input NOR gates 38–40, and a delay circuit 41. NAND gates 21 and 22, and NAND gates 23 and 24 form flipflops FF1 and FF2, respectively. NAND gates 25 and 26, NAND gates 27 and 28, NAND gates 29 and 30, and NAND gates 31 and 32 form a master gate G1, a master flipflop FF3, a slave gate G2, and a slave flipflop FF4, respectively. Gates G1, G2, flipflops FF3, FF4, and inverter 34 form a master slave flipflop 42.

Refresh signal Ref is applied to one input node of NAND gate 20 via delay circuit 41. Clock signal ECLK is applied to the other input node of NAND gate 20 via inverter 33. Flipflop FF1 is set by-refresh signal Ref, and reset by output φ20 of NAND gate 20. NOR gate 38 receives an output φ21 of flipflop FF1 and an output of inverter 33. The output of NOR gate 38 is clock signal CLK 23.

Flipflop FF2 is set by refresh signal Ref, and reset by clock signal CLK 23. Master slave flipflop 42 is controlled by clock signal CLK 23 and receives an output of flipflop FF2. Slave flipflop FF4 is set by an ANDed signal of an output of NAND gate 30 and refresh signal Ref.

An inversion output φ31 of slave flipflop FF4 is applied to inverter 35. NOR gate 39 receives an output of inverter 35 and clock signal ECLK. Inverter 36 receives an output of NOR gate 39 to provide clock signal CLK 21. NOR gate 40 receives an output of inverter 35 and clock signal RCLK. Inverter 37 receives an output of NOR gate 40 and clock signal CLK 22.

The operation of gate circuit 12 of FIG. 5 will be described hereinafter. A circuit receiving refresh signal Ref and clock signal ECLK to provide clock signal CLK 23 will first be described. When refresh signal Ref attains an inactive state of an L level, flipflop FF1 is set and output φ21 of flipflop FF1 is fixed to an H level. Therefore, clock signal CLK 23 which is an output of NOR gate 38 attains an L level irrespective of clock signal ECLK.

When refresh signal Ref attains an active state of an H level, flipflop FF1 is reset and output φ21 of flipflop FF1 is fixed to an L level. Therefore, clock signal ECLK is inverted by inverter 33 and then passes through NOR gate 38 to be output as clock signal CLK 23.

Figure 6:
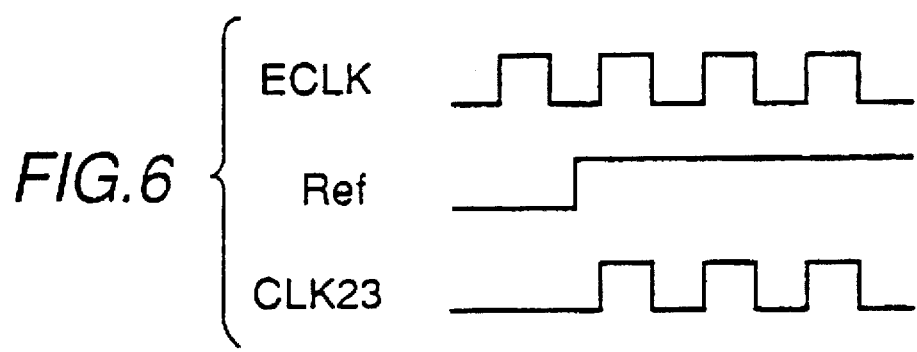
FIGS. 6–9 are timing charts for describing an operation of the gate circuit of FIG. 5.
Figure 7:
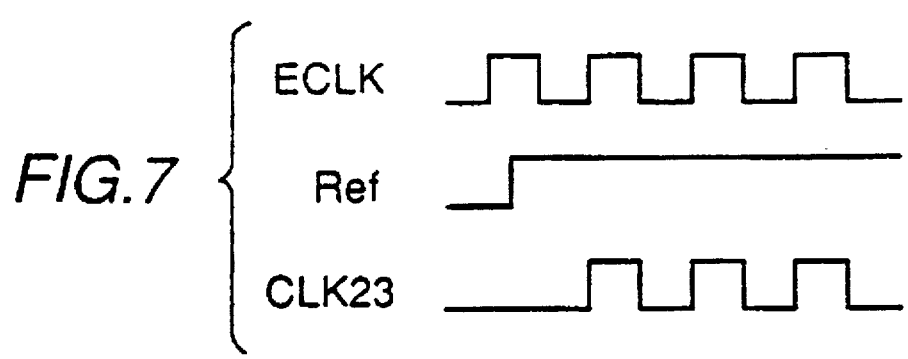

It is to be noted that the operation of the case where refresh signal Ref is pulled up to an H level when clock signal ECLK attains an L level as shown in FIG. 6 differs from the case where refresh signal Ref is pulled up to an H level when clock signal ECLK attains an H level as shown in FIG. 7.

More specifically, when clock signal ECLK attains an L level at the rise of refresh signal Ref to an H level, output φ20 of NAND gate 20 is pulled down to an L level, whereby flipflop FF1 is reset. As a result, output φ21 of flipflop FF1 is pulled down to an L level, whereby clock signal ECLK passes through NOR gate 38.

In contrast, when clock signal ECLK attains an H level at the rise of refresh signal Ref to an H level, output φ20 of NOR gate 20 is driven to an H level. Flipflop FF1 is not reset, and output φ21 of flipflop FF1 attains an H level. Therefore, clock signal ECLK will not pass through NOR gate 38. When clock signal ECLK is then driven to an L level, output φ21 of flipflop FF1 is pulled down to an L level and clock signal ECLK will pass through NOR gate 38. In other words, following the rise of refresh signal Ref to an H level, clock signal ECLK passes through NOR gate 38 after it is driven to an L level.

Figure 8:
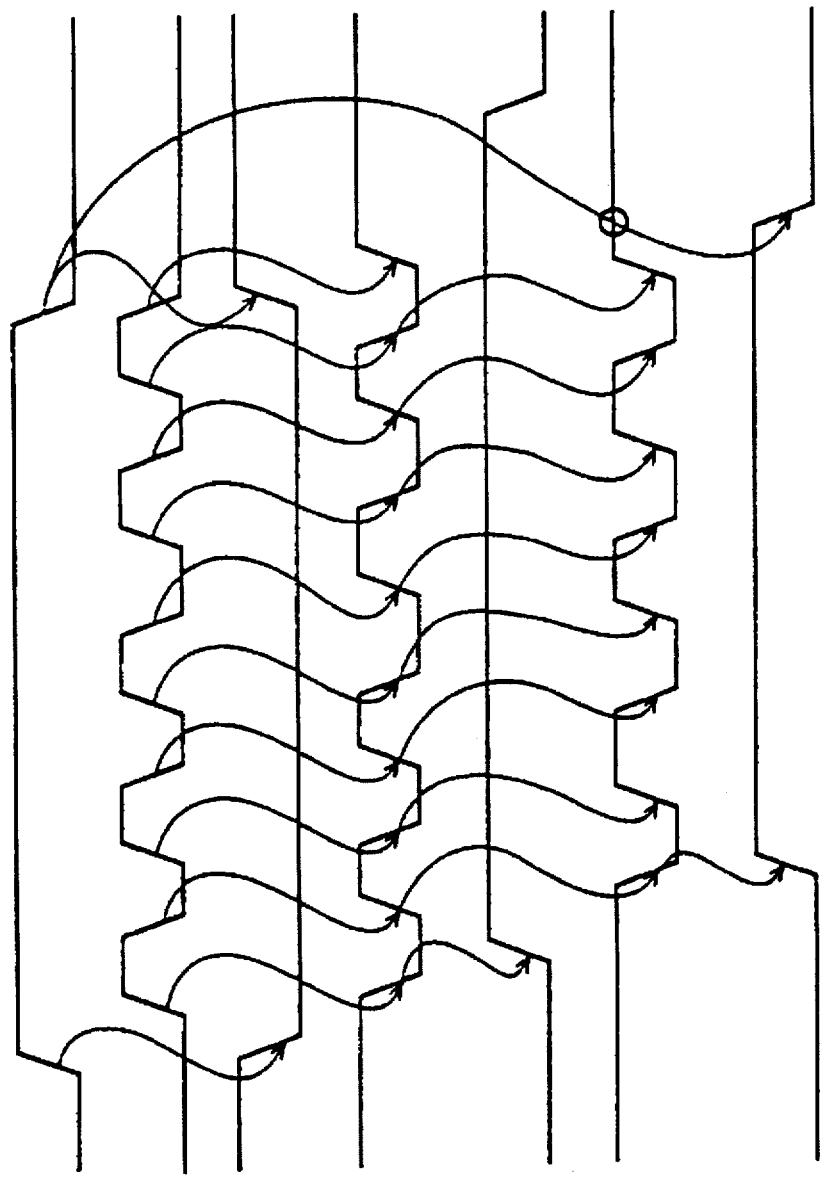

A circuit in FIG. 5 receiving refresh signal Ref and clock signals CLK 23, ECLK and RCLK to provide clock signals CLK 21 and CLK 22 will be described hereinafter. Referring to FIG. 8, when refresh signal Ref is pulled up to an H level from the state where refresh signal Ref and clock signal CLK 23 both attain an L level, flipflop FF2 is reset to drive output φ24 thereof to an L level. Here, inversion output φ23 of flipflop FF2 is maintained at the H level.

The output of flipflop FF2 is transmitted to master flipflop FF3 via master gate G1 when clock signal CLK 23 next attains an H level, and further transmitted to slave flipflop FF4 via slave gate G2 when clock signal CLK 23 next attains an L level. More specifically, inversion output φ31 of slave flipflop FF4 is pulled up to an H level at the elapse of 1 clock from the fall of output φ24 of flipflop FF2.

The rise of inversion output φ31 of flipflop FF4 to an H level causes output φ35 of inverter 35 to be pulled down to an L level. As a result, clock signal ECLK passes through NOR gate 39 to be inverted by inverter 36 and output as clock signal CLK 21. Simultaneously, clock signal RCLK passes through NOR gate 40 to be inverted by inverter 37, and is output as clock signal CLK 22.

When refresh signal Ref is pulled down to an L level at an elapse of a predetermined time period, flipflop FF1 is set to pull up output φ21 thereof to an H level. Clock signal CLK 23 which is the output of NOR gate 38 is fixed at the L level. As a result, the transmission operation of master slave flipflop 42 is disabled. Also, slave flipflop FF4 is set, whereby inversion output φ31 of slave flipflop FF4 is pulled down to an L level. Passage of clock signals ECLK and RCLK is inhibited by NOR gates 39 and 40, respectively.

Figure 9:
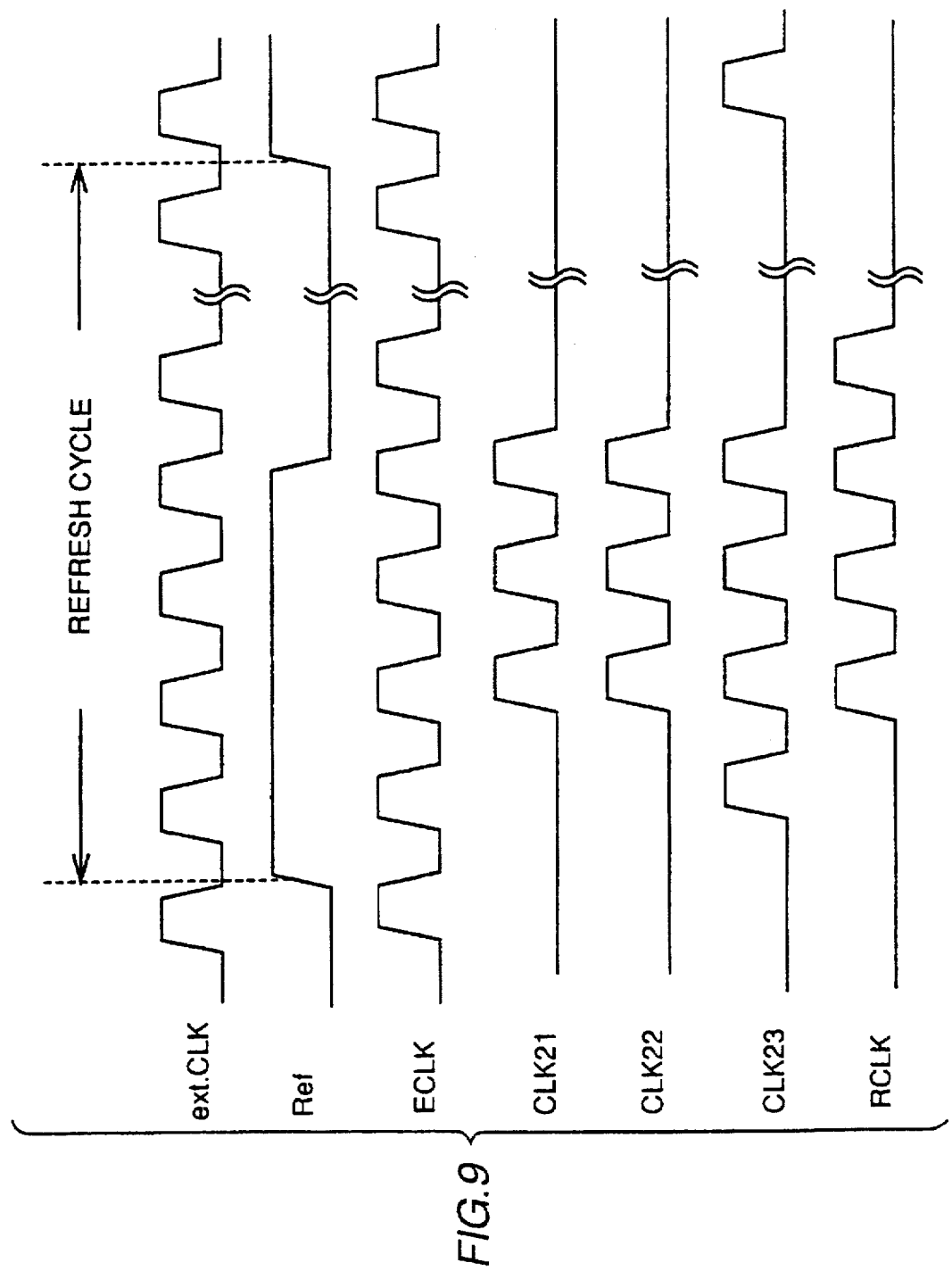
Figure 10:
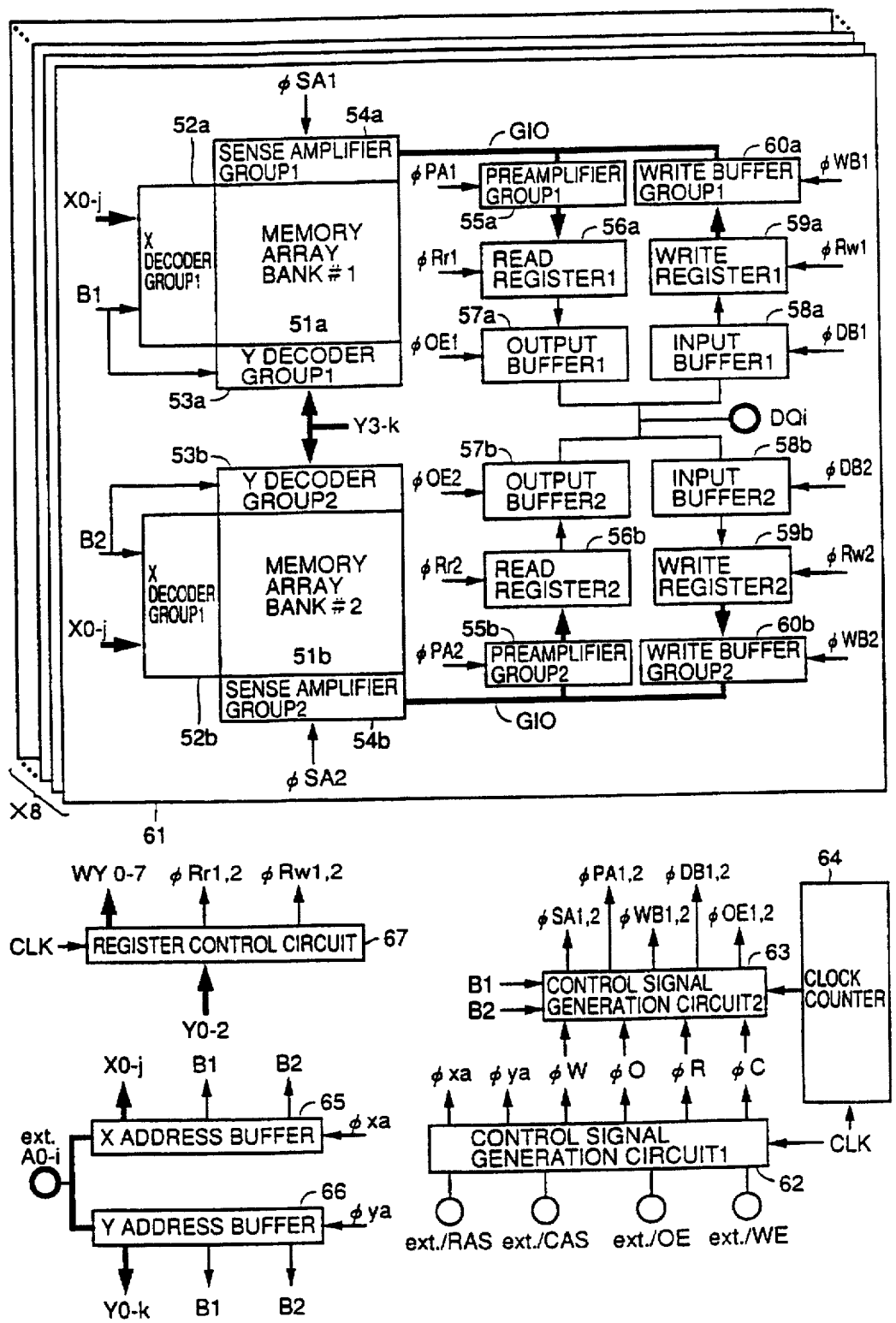
FIG. 10 is a block diagram functionally showing a structure of the main components of a conventional SDRAM.
Figure 11:
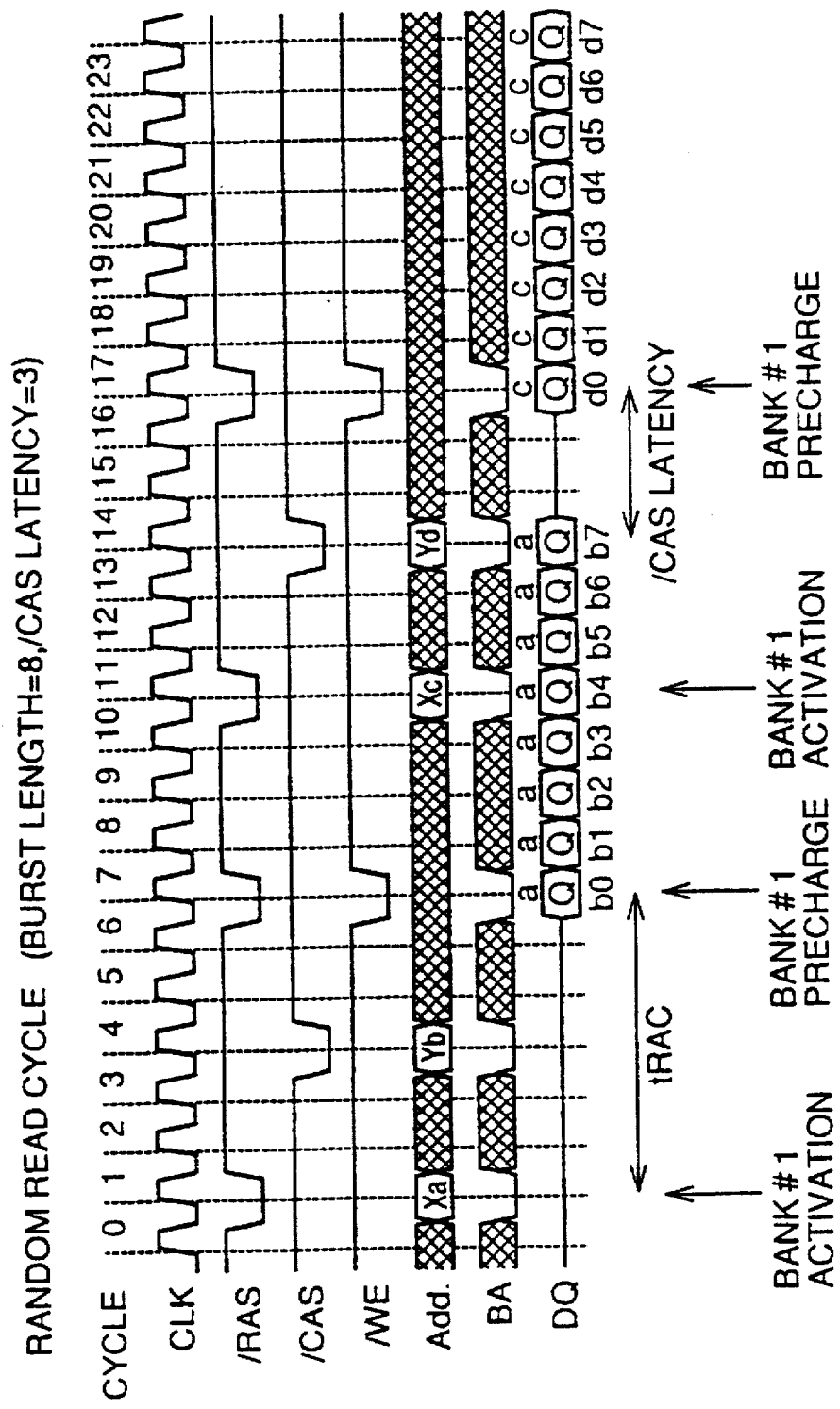
FIGS. 11 and 12 are timing charts showing a readout operation and a writing operation, respectively, of the SDRAM of FIG. 10.
Figure 12:
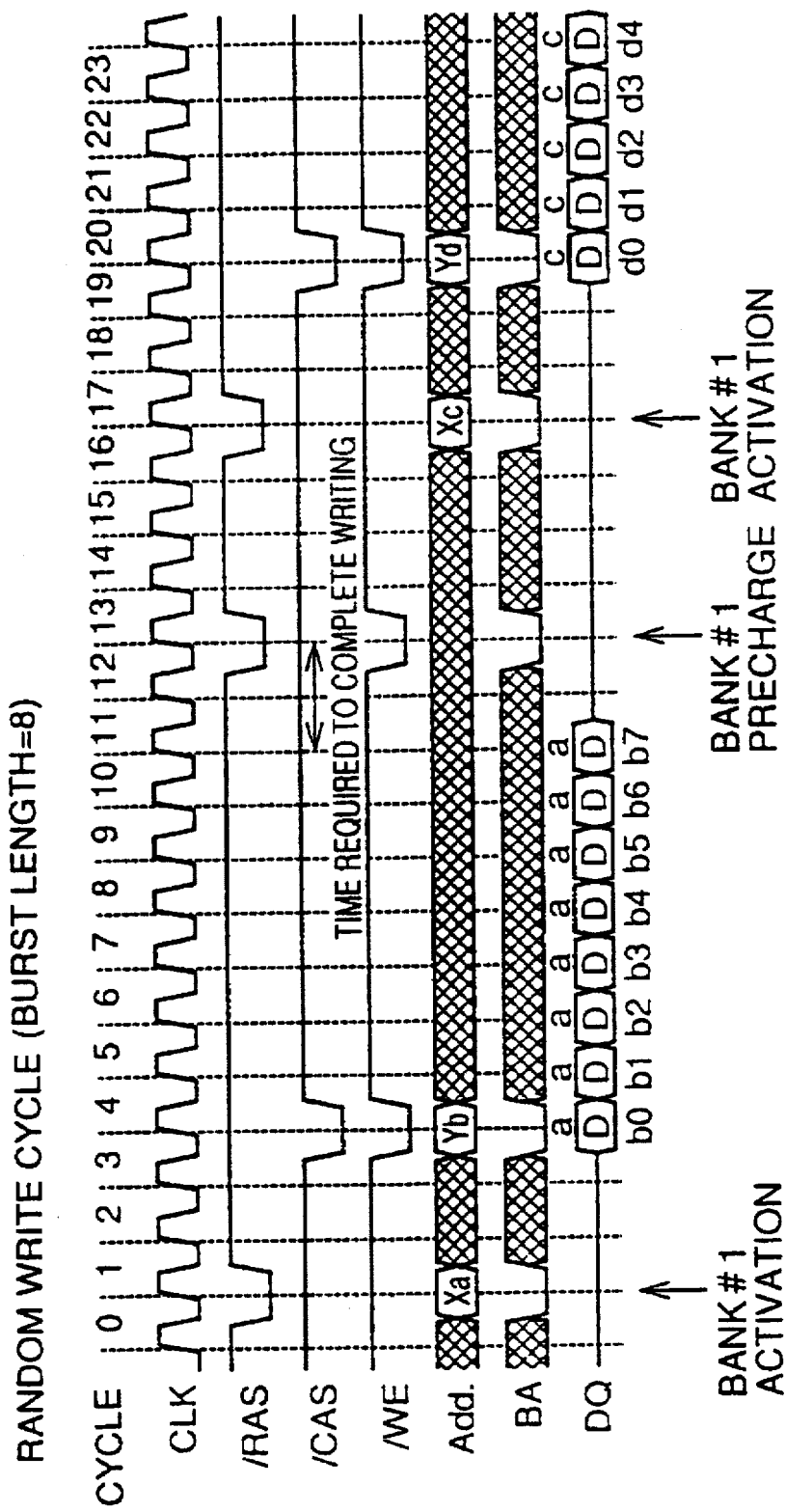
Figure 13:
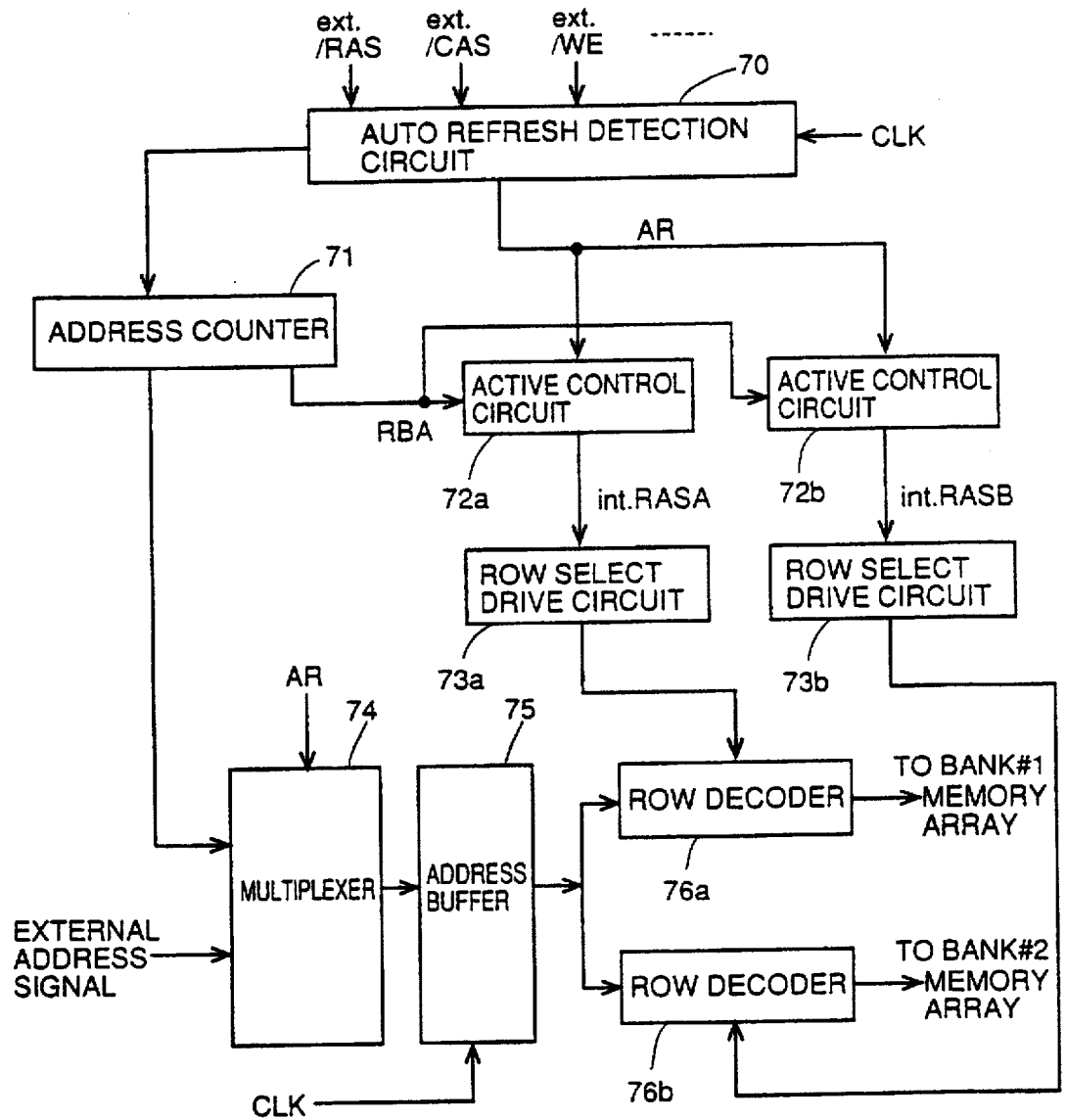
FIG. 13 is a block diagram showing a structure of the SDRAM of FIG. 10 associated with an auto-refresh mode.
Figure 13:
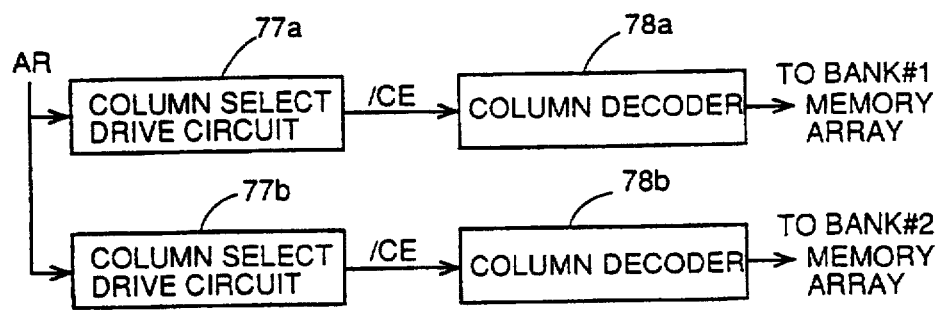
Figure 14:
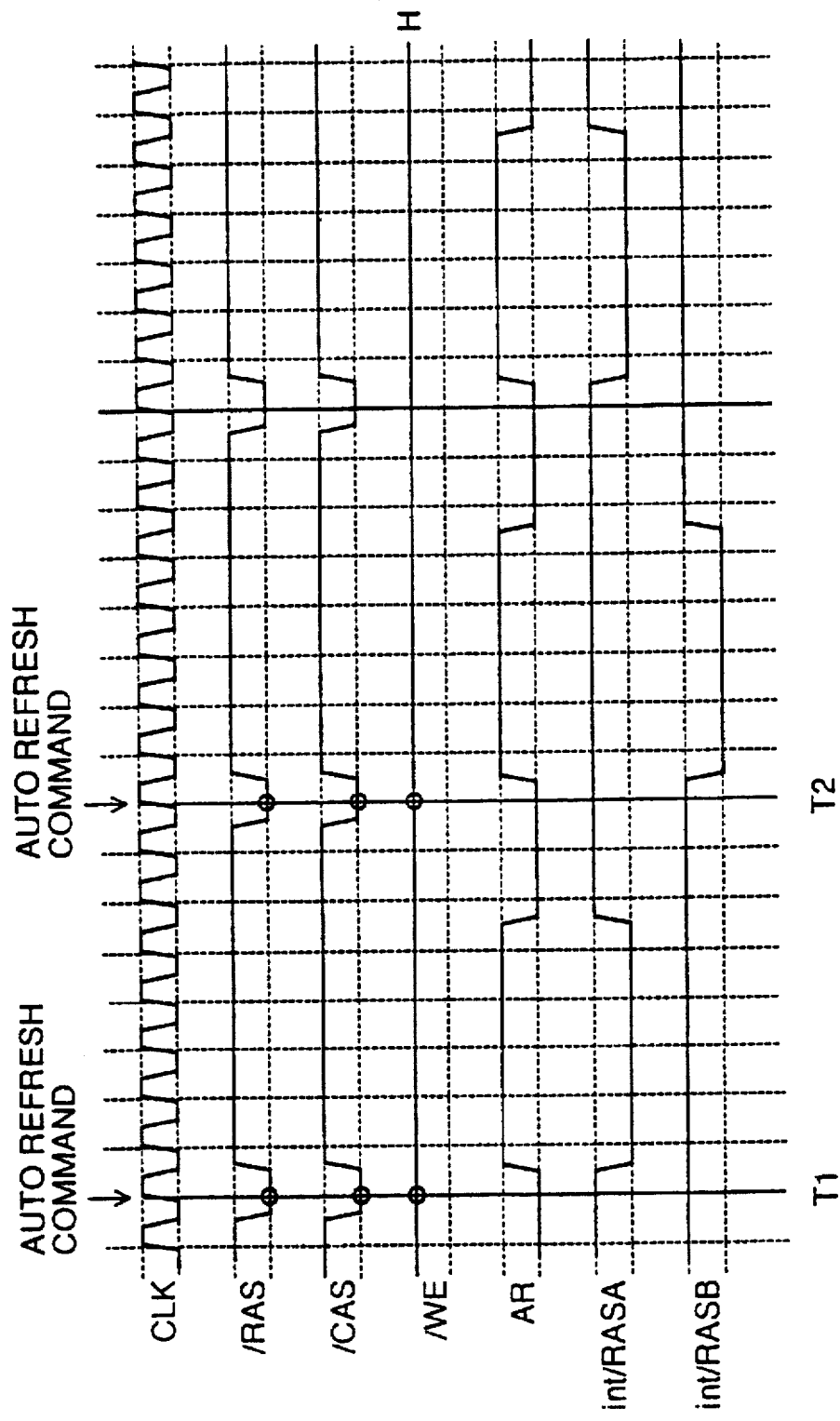
FIG. 14 is a timing chart showing an operation of the components associated with the auto-refresh mode of FIG. 13.

According to the gates circuit 12 of FIG. 5, clock signal CLK 23 is output after refresh signal Ref is driven to an H level, and then clock signals CLK 21 and CLK 22 are output 1 clock after, as shown in FIG. 9. The output of clock signals CLK 21, CLK 22 and CLK 23 can be inhibited simultaneously after refresh signal Ref is pulled down to an L level. Thus, provision of clock signals CLK 21 and CLK 22 to phase comparator 92 and inhibition of provision thereof can be carried out simultaneously to prevent unstable operation of phase comparator 92.

In FIG. 4, switches 13, 14 and 15 each include two switching contacts 13a, 13b; 14a, 14b; 15a, 15b; and one common contacts 13c, 14c and 15c, respectively. One switching contacts of 13a, 14a and 15a of switches 13, 14, and 15 receive clock signals CLK 11, CLK 12, and CLK 13, respectively, from gate circuit 11. The other switching contacts 13b, 14b and 15b of switches 13, 14 and 15 receive clock signals CLK 21, CLK 22, and CLK 23, respectively, from gate circuits 12. The common contacts 13c, 14c, and 15c of switches 13, 14, and 15 are connected to clock signal output terminals 10f, 10g, 10h, respectively, of refresh control circuit 10.

Switches 13, 14 and 15 are all controlled by a self refresh detection signal SR. When self refresh detection signal SR attains an inactive state of an L level, one switching contacts 13a, 14a and 15a and common contacts 13c, 14c and 15c of switches 13, 14, and 15, respectively, conduct. When self refresh detection signal SR attains an active state of an H level, the other switching contacts 13b, 14b and 15b are connected to common contacts 13c, 14c, 15c, respectively, of switches 13, 14 and 15.

The operation of the DLL circuit shown in FIGS. 3–9 will be described hereinafter. When a mode other than the auto-refresh mode and the self refresh mode is designated and auto refresh detection signal AR, self refresh detection signal SR and refresh signal Ref all attain an inactive state of an L level, gate circuit 11 passes clock signals ECLK and RCLK and gate circuit 12 inhibits passage of clock signals ECLK and RCLK. Switching contacts 13a, 14a and 15a are connected to common contacts 13c, 14c and 15c, respectively in switches 13, 14 and 15. Therefore, clock signal ECLK is applied to phase comparator 92 and voltage control delay circuit 95 via switches 13 and 15, respectively. Clock signal RCLK is applied to phase comparator 92 via gate circuit 11 and switch 14, whereby the DLL circuit operates.

When auto refresh detection signal AR attains an active state of an H level and self refresh signal detection signal SR and refresh signal Ref attain an inactive state of an L level in an auto-refresh mode, gate circuits 11 and 12 both inhibit passage of clock signals ECLK and RCLK. Therefore, input of clock signals ECLK and RCLK to phase generator 92 and voltage control delay circuit 95 is inhibited. Thus, the DLL circuit is disabled.

When auto refresh detection signal AR attains an inactive state of an L level and self refresh detection signal SR attains an active state of an H level, and refresh signal Ref periodically attains an H level in a self refresh mode, gate circuit 11 inhibits passage of clock signals ECLK and RCLK, and gate circuit 12 provides clock signals CLK 21, CLK 22 and CLK 23 in response to reset signal Ref attaining an H level. The other switching contacts 13b, 14b and 15b are connected to common contacts 13c, 14c and 15c, respectively, of switches 13, 14 and 15.

Therefore, when refresh signal Ref attains an H level, clock signals CLK 21 and CLK 22 are applied to phase comparator 92 via switches 13 and 14, and clock signal CLK 23 is applied to voltage control delay circuit 95 via switch 15. Therefore, the DLL circuit operates intermittently.

According to the present embodiment, reduction of the power consumption and recovery time after a self refresh mode can be reduced by virtue of the DLL circuit operating intermittently according to specification of a self refresh mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device having a mode requiring an internal clock signal and a mode not requiring said internal clock signal, comprising:

a plurality of memory arrays including a plurality of memory cells arranged in a matrix, an internal clock generation circuit for generating said internal clock signal in synchronization with an external clock signal, a data input/output circuit for carrying out data input and output between a selected memory cell in said plurality of memory arrays and an external source in synchronization with said internal clock signal, and a control circuit for inactivating said internal clock generation circuit for a predetermined time period in response to designation of said mode not requiring said internal clock signal.

2. The synchronous semiconductor memory device according to claim 1, wherein said mode not requiring said internal clock signal includes an auto-refresh mode in which a memory array different from a previously refreshed memory array out of said plurality of memory arrays is refreshed.

3. The synchronous semiconductor memory device according to claim 1, wherein said mode not requiring said internal clock signal comprises a self refresh mode in which said plurality of memory arrays are sequentially refreshed in said self refresh mode.

4. The synchronous semiconductor memory device according to claim 1, wherein said mode not requiring said internal clock signal comprises an auto-refresh mode that refreshes a memory array different from a previously refreshed memory array out of said plurality of memory arrays, and a self refresh mode that sequentially refreshes said plurality of memory arrays, wherein said control circuit comprises a first signal generation circuit for providing an auto refresh detection signal for only a predetermined time period according to specification of said auto-refresh mode by a control signal, a second signal generation circuit for providing a self refresh detection signal during designation of a start of said self refresh mode to termination of that self refresh mode by said control signal, and a gate circuit for inhibiting input of said external clock signal to said internal clock generation circuit according to one of said auto refresh detection signal and said self refresh signal from one of said first and second signal generation circuits, said synchronous semiconductor memory device further comprises a refresh circuit for carrying out said auto-refresh mode according to said auto refresh detection signal from said first signal generation circuit, and carrying out said self refresh mode according to said self refresh detection signal from said second signal generation circuit.

5. The synchronous semiconductor memory device according to claim 3, wherein said control circuit comprises a first signal generation circuit for providing a self refresh detection signal during designation of a start of said self refresh mode to designation of termination of that self refresh mode, a first gate circuit for inhibiting input of said external clock signal to said internal clock generation circuit in response to said self refresh detection signal from said first signal generation circuit, a second signal generation circuit for providing an activation signal at a predetermined period in response to said self refresh detection signal from said first signal generation circuit, and a second gate circuit for providing said external clock signal to said internal clock generation circuit in response to said activation signal from said second signal generation circuit.

* * * * *